(12) United States Patent
Setta

(10) Patent No.: US 7,927,764 B2
(45) Date of Patent: Apr. 19, 2011

(54) EXPOSURE MASK AND METHOD OF MANUFACTURING A SEMICONDUCTOR DEVICE

(75) Inventor: Yuji Setta, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 676 days.

(21) Appl. No.: 11/867,374

(22) Filed: Oct. 4, 2007

(65) Prior Publication Data

US 2008/0085457 A1 Apr. 10, 2008

(30) Foreign Application Priority Data

Oct. 5, 2006 (JP) .................................. 2006-274432

(51) Int. Cl.
*G03F 1/00* (2006.01)
*G03C 5/00* (2006.01)

(52) U.S. Cl. ........................................... 430/5; 430/394

(58) Field of Classification Search .............. 430/5, 311, 430/394
See application file for complete search history.

(56) References Cited

U.S. PATENT DOCUMENTS

| | | | |
|---|---|---|---|
| 2002/0012858 A1 * | 1/2002 | Kawakubo et al. | 430/22 |
| 2005/0136336 A1 * | 6/2005 | Schacht et al. | 430/5 |
| 2006/0073425 A1 * | 4/2006 | Miyazaki et al. | 430/322 |

FOREIGN PATENT DOCUMENTS

JP 2002-287324 A 10/2002

* cited by examiner

*Primary Examiner* — Stephen Rosasco
*Assistant Examiner* — Rashid Alam
(74) *Attorney, Agent, or Firm* — Fujitsu Patent Center

(57) ABSTRACT

A method of manufacturing a film pattern includes forming a film over a substrate, applying a photoresist over the film, exposing the photoresist using a first mask pattern including a first mask opening and a second mask opening, and an optical proximity correction being applied only to the first mask opening, exposing the photoresist using a second mask pattern including a third mask opening and a fourth mask opening, an optical proximity correction being applied only to the fourth mask opening.

20 Claims, 33 Drawing Sheets

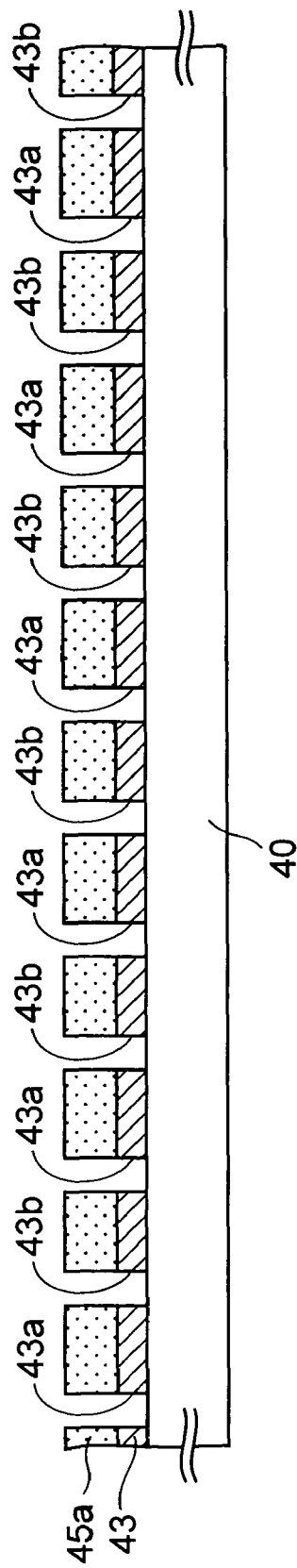
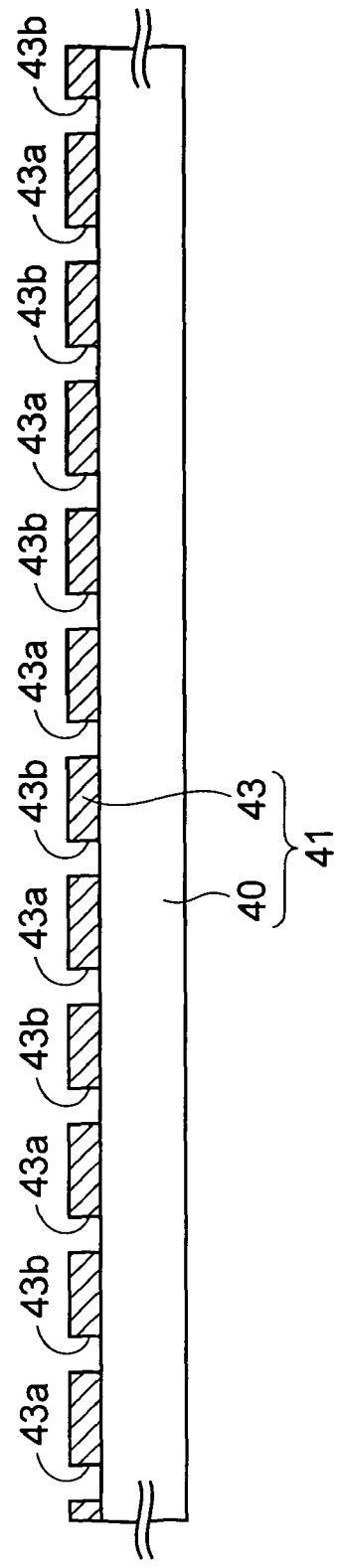

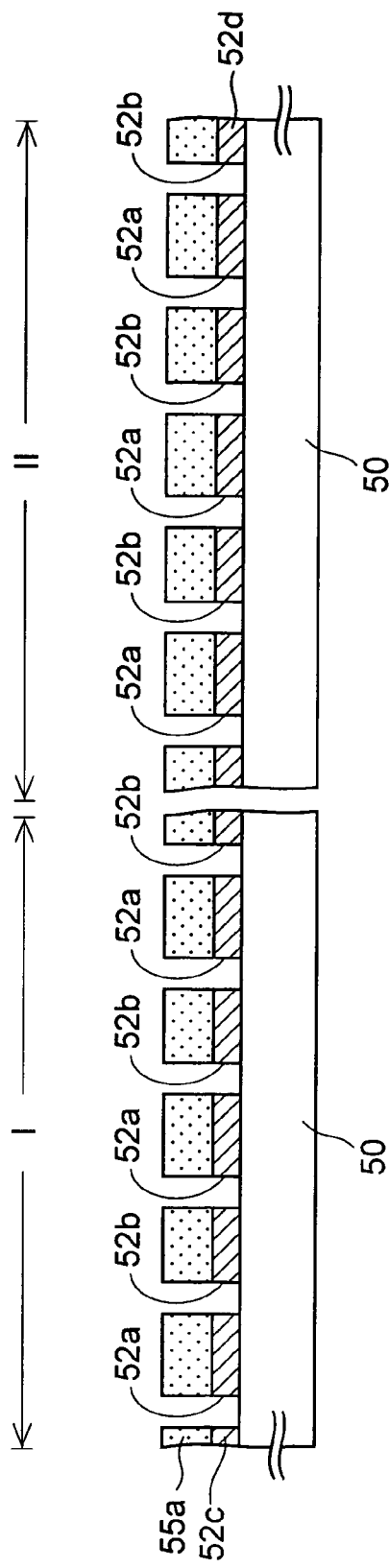
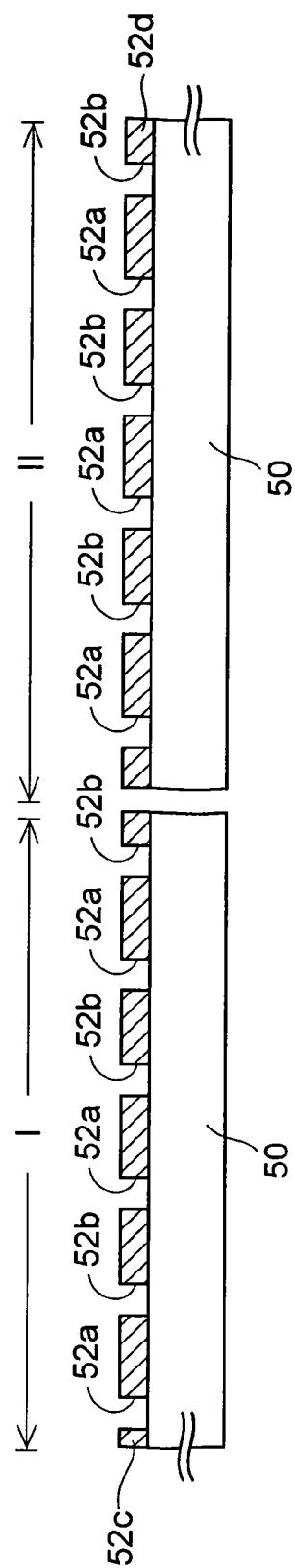

EXPOSURE MASK AND METHOD OF MANUFACTURING A SEMICONDUCTOR DEVICE

CROSS-REFERENCE TO RELATED APPLICATIONS

This application is based on and claims priority of Japanese Patent Application No. 2006-274432 filed on Oct. 5, 2006, the entire contents of which are incorporated herein by reference.

BACKGROUND OF THE INVENTION

1. Field of the Invention

The present invention relates to a film patterning method, an exposure mask and an exposure mask set.

2. Description of the Related Art

These years, continuous demand for fabricating semiconductor devices, such as LSI circuits, in an increasingly microscopic scale has developed into demand for device patterns each with a line width shorter than a wavelength of a light source for exposure which is used in an exposure system available in the commercial market. To satisfy the demand, resolution enhanced technologies including phase shift masks and annular illumination have been adopted for an exposure step.

Mainly, there are halftone masks and Levenson masks in the phase shift masks.

FIG. 1 is a diagram schematically showing an intensity curve $I_0$ of exposure light which has passed through a halftone mask 100. The halftone mask 100 is obtained by forming a mask pattern 102 on a transparent substrate 101 made of quartz or the like. The mask pattern 102 is made of a translucent film, such as a MoSi film, with a light transmittance of approximately 4% to 20%. The film thickness of the mask pattern 102 is set to such a value that exposure light A which has passed through the mask pattern 102 can be shifted in phase by just 180 degrees from exposure light B which has passed through a mask opening 102a.

In the halftone mask 100, such a phase shift causes the exposure light A and the exposure light B to cancel each other at an edge portion of the mask opening 102a. This makes the intensity curve $I_0$ rise sharp compared with dotted line (it raised from non-phase shift mask), and accordingly makes the contrast of a projection image of the mask opening 102a sharp. This makes it possible to obtain a sufficiently fine resolution.

FIG. 2 is a cross-sectional view of a Levenson mask.

The Levenson mask 110 is made of a transparent substrate 101 and a mask pattern 111. A concave portion 101a is formed in the transparent substrate 101. The mask pattern 111 is formed on this transparent substrate 101, and is made of a light shielding film such as a Cr film.

In the Levenson mask 100, phase difference between the exposure lights A and B become 180 degree, where the exposure light A being passed through the concave portion 101a and the exposure light B being passed through a mask opening 111a formed in the flat surface of the transparent substrate 101. This phase difference causes the exposure lights A and B to cancel each other, so that it is made possible to obtain a fine resolution as in the case of the halftone mask.

A double-pitch, double-exposure method as in Japanese Patent Application Laid-open Publication No. 2002-287324 has also been proposed for the device patterns, which is so highly integrated that the sufficient resolution cannot be obtained by the phase shift masks.

In the double-pitch, double-exposure method, a plurality of holes is classified into two groups. Then, using different masks for the respective groups, all of the holes are formed by carrying out the exposure twice. According to this method, a pitch (center-to-center distance) between each two adjacent hole patterns corresponding to holes in the respective masks is set to be more than twice as large as its original pitch. Therefore, it is made possible to make the distance between each adjacent hole patterns wider, and to accordingly make the depth of focus larger during exposure.

SUMMARY OF THE INVENTION

According to one aspect of the present invention, a method of manufacturing a film pattern includes forming a film over a substrate, applying a photoresist over the film, exposing the photoresist using a first mask pattern including a first mask opening and a second mask opening, and an optical proximity correction being applied only to the first mask opening, exposing the photoresist using a second mask pattern including a third mask opening and a fourth mask opening, an optical proximity correction being applied only to the fourth mask opening.

BRIEF DESCRIPTION OF THE DRAWINGS

FIGS. 21A to 21D are cross-sectional views of the exposure mask in the course of manufacturing.

FIGS. 26A to 26D are cross-sectional views of the exposure mask according to the second embodiment of the present invention in the course of manufacturing.

DESCRIPTION CF THE PREFERRED EMBODIMENT

Figure 1:
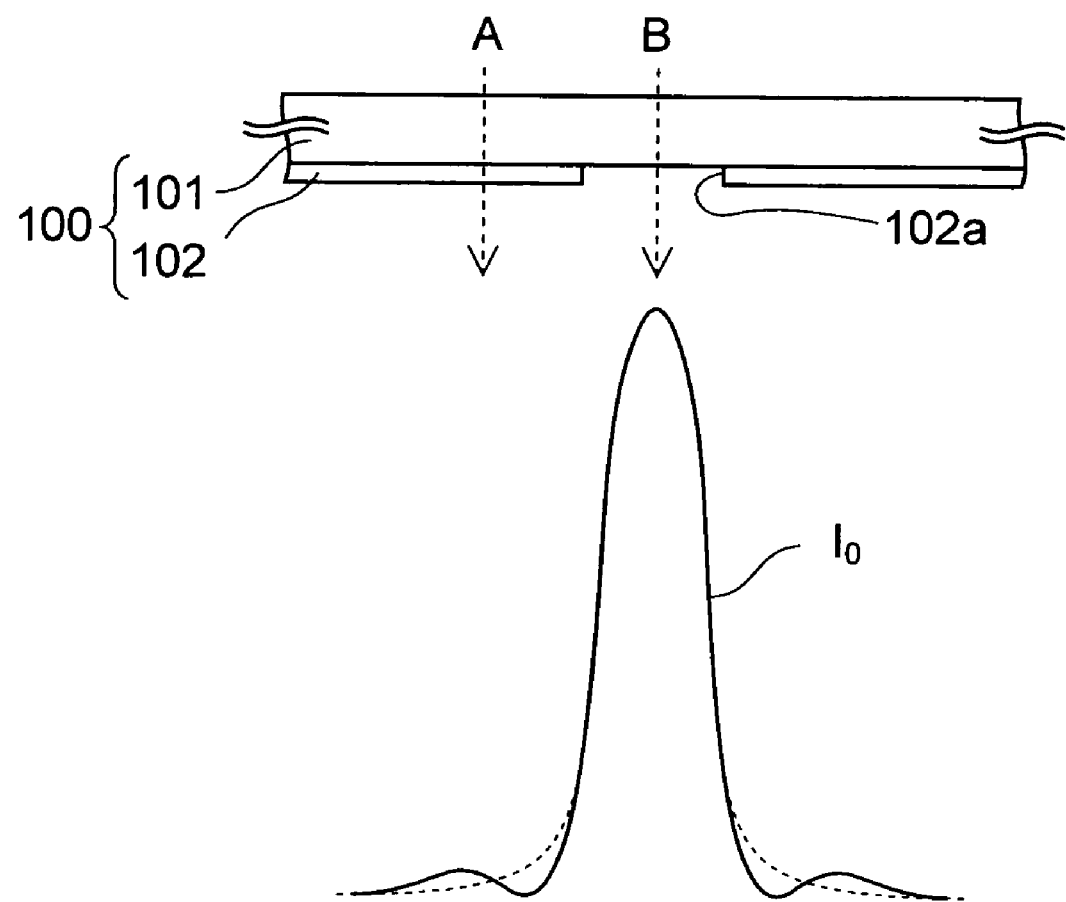
FIG. 1 is a diagram schematically showing the intensity curve of exposure light passed through a halftone mask.
Figure 2:
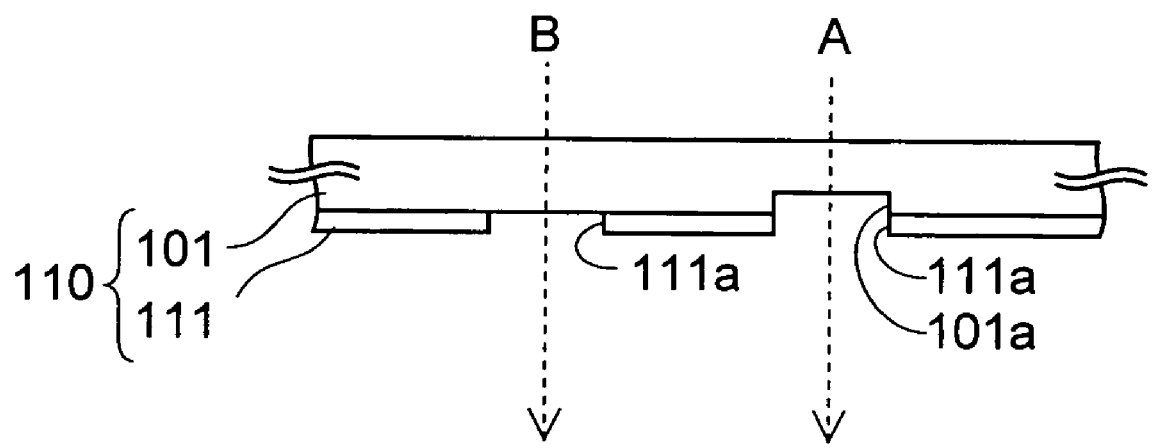
FIG. 2 is a cross-sectional view of a Levenson mask.
Figure 3:
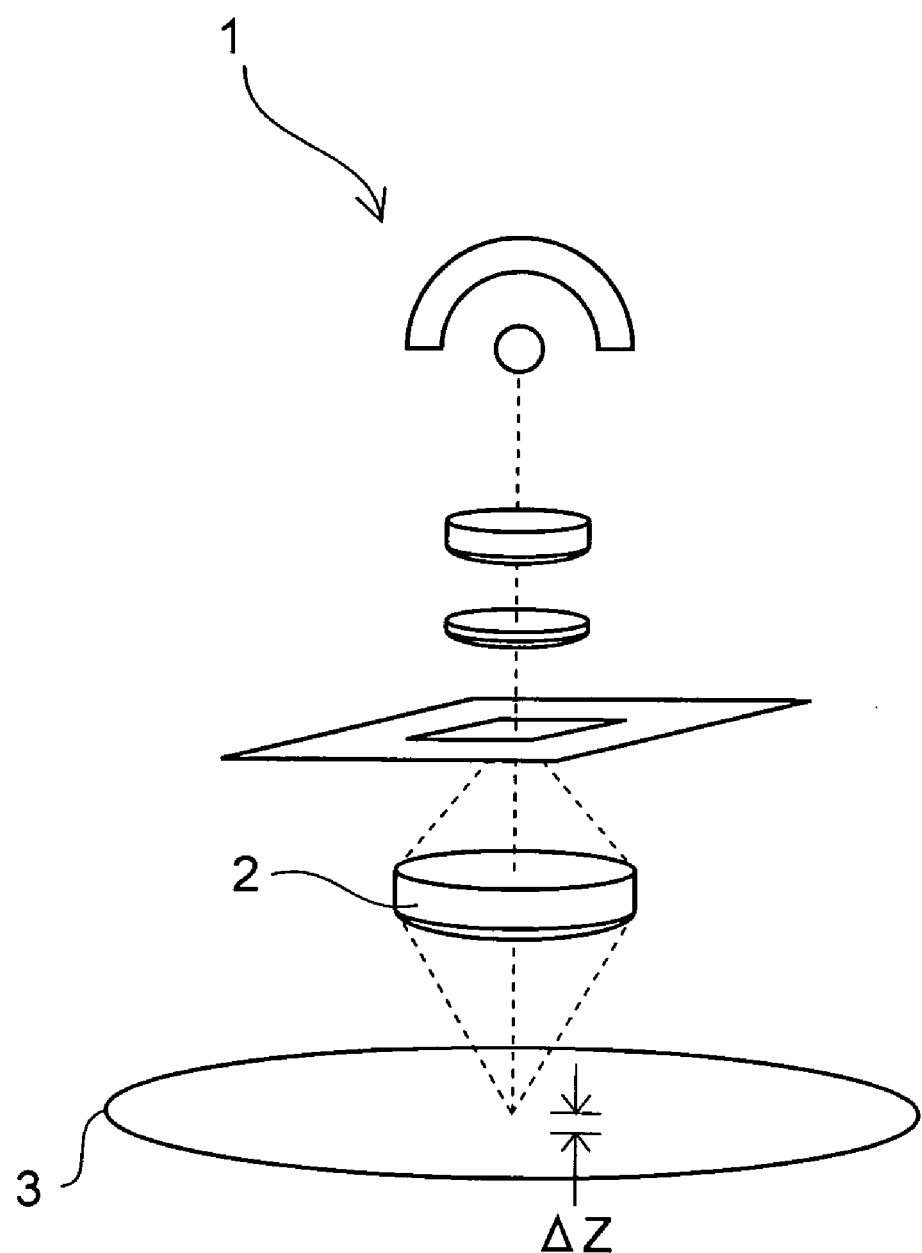
FIG. 3 is a diagram illustrating how a defocus occurs due to an exposure system.
Figure 4:
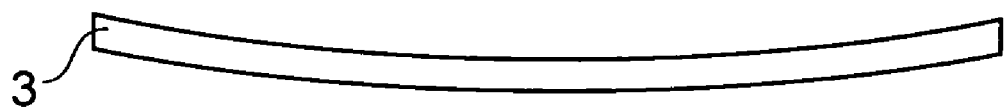
FIG. 4 is a diagram illustrating how a defocus occurs due to a warp of a substrate.
Figure 5:
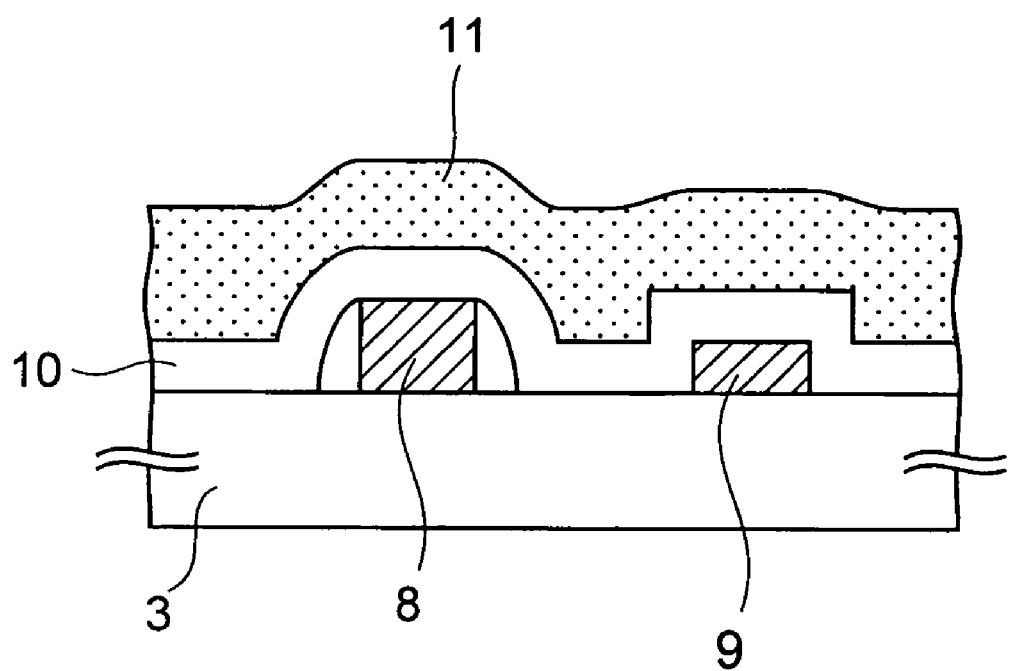
FIG. 5 is a diagram illustrating how a defocus occurs due to an unevenness of a surface of an interlayer insulating film.

In the step of exposing a photoresist, various factors cause a defocus. FIGS. 3 to 5 are diagrams showing factors of the defocus.

In an example shown in FIG. 3, an error of an exposure system 1, such as variation in the focal length of a projection lens 2 due to fluctuation of the atmospheric pressure, makes the focal point out of a silicon substrate 3, so that the defocus ΔZ occurs.

Note that the silicon substrate 3 may warp as shown in FIG. 4 in some cases. This is because various films with the different stresses are stacked on one another on the silicon substrate 3 in the process of manufacturing semiconductor devices. In this case, even if a vicinity of the center of the substrate 3 keeps the best focus for example, a defocus occurs in the peripheries of the silicon substrate 3.

Moreover, due to the gate electrode 3 and interconnect 9 on the silicon substrate 3, an unevenness appears in the surface of the interlayer insulating film 10 in some cases. In these cases, since the unevenness is also formed in the surface of the photoresist 11 which is to be exposed, local defocus is caused due to the unevenness.

If the depth of focus of an exposure mask is shorter, a finished dimension of the resist pattern becomes different from the designed dimension in the case where the defocus occurs due to any one of the reasons described by use of FIGS. 3 to 5. This makes the semiconductor of the final products defective and become a factor of decreasing the yields of the semiconductor device.

Following Equations (1) and 2) are both called as Rayleigh equations, and they respectively determine the resolution R and the depth of focus DOF of an exposure mask:

$$R = k_1 \frac{\lambda}{NA} \quad (1)$$

$$DOF = k_2 \frac{\lambda}{(NA)^2}. \quad (2)$$

Here, NA denotes the numerical aperture, and denotes the wavelength of an exposure light. k1 and k2 are constants determined by a material of a photoresist and an exposure condition. Note that the resolution R is defined as minimum pitches between windows formed in the photoresist.

As shown by the Equation (1), for the purpose of increasing the resolution R of the exposure mask (i.e., for making shorter the minimum pitches between two neighboring windows), it suffices to increase the numerical aperture NA.

By contrast, since a square of the numerical aperture NA is appeared in the denominator of Equation (2) for determining the depth of focus DOF, the DOF is rapidly shorten if the numerical aperture NA is enlarged in order to reduce the resolution R.

In this manner, the resolution R of the exposure mask and the depth of focus DOF are in a trade-off relationship. Therefore, if the resolution R is intended to be reduced in accordance with a design rule, the depth of focus DOF then becomes smaller.

Accordingly, as the design rule becomes increasingly smaller, it becomes difficult to resolve the photoresist, even if the defocus due to any one of the factors described in FIGS. 3 to 5 is slight, so that it becomes difficult to form a photoresist with a desired dimension.

Figure 6:
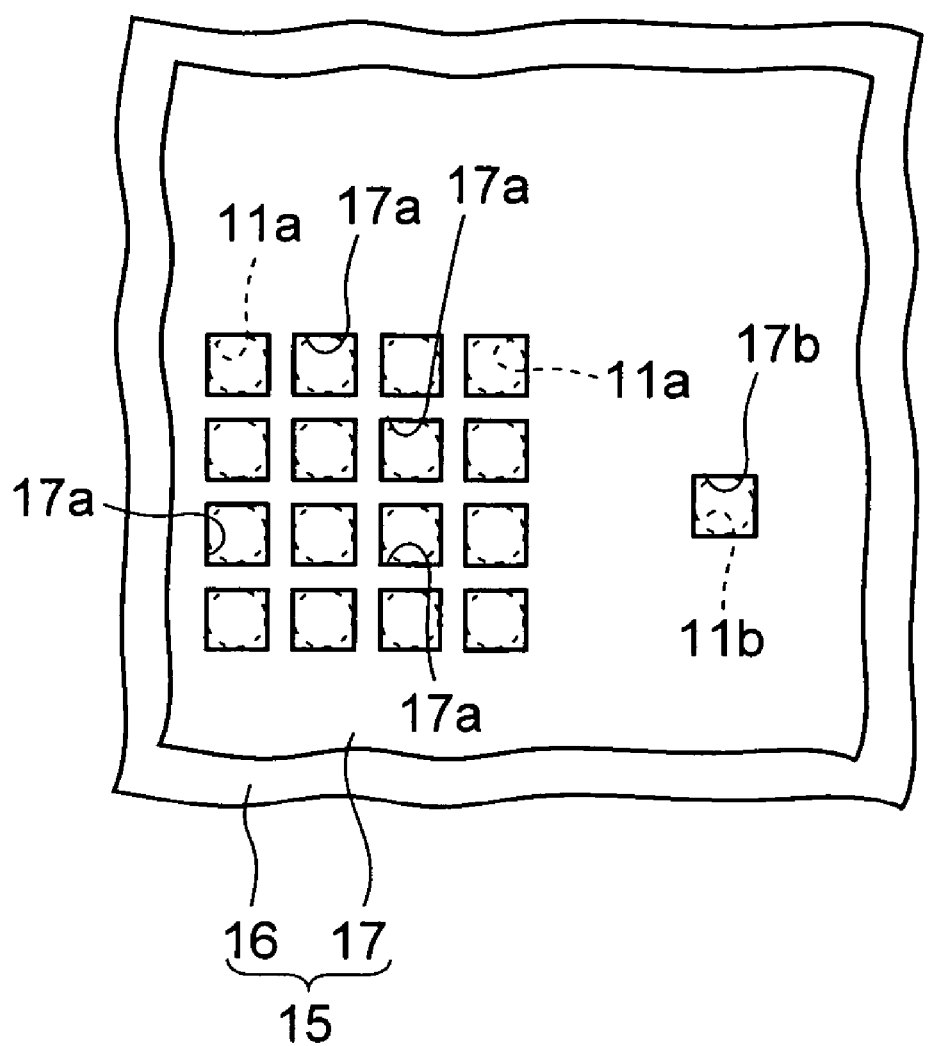
FIG. 6 is a plan view of an exposure mask having densely-formed mask openings and sparsely-formed mask opening.

FIG. 6 is a plan view of an exposure mask 15 constructed from a transparent substrate 16 and mask pattern 17. In the illustrated case, first mask openings 17a are formed densely in the mask pattern 17, and second mask openings 17b are formed sparsely in the mask pattern 17.

It should be noted that windows 11a and 11b which are formed in a photoresist by resolving the first mask openings 17a and the second mask openings 17b are additionally illustrated in FIG. 6.

Figure 7:
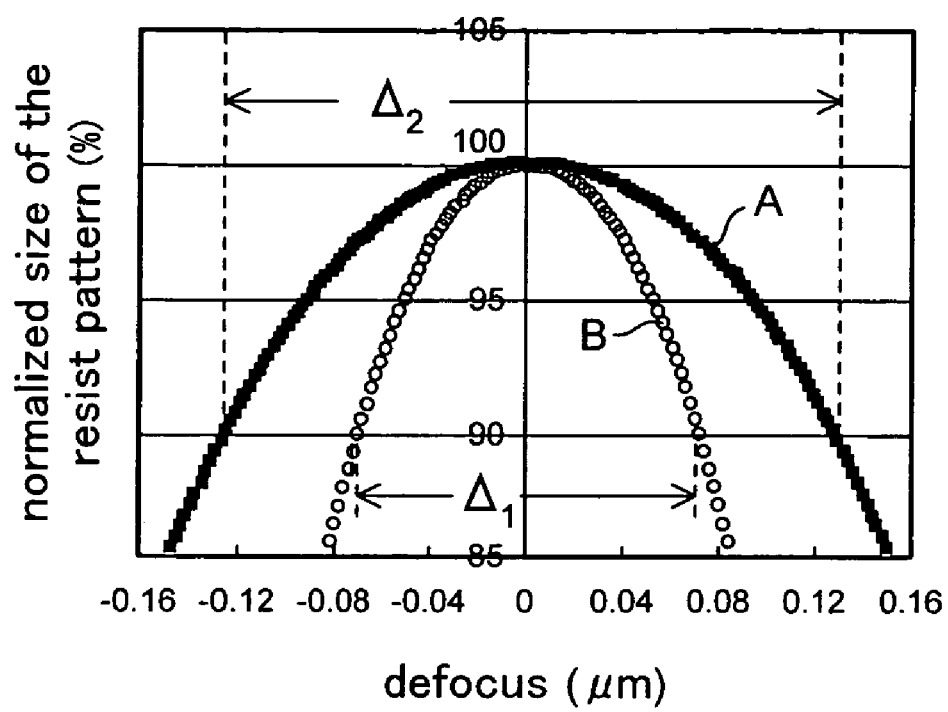
FIG. 7 is a diagram showing CD-FOCUS curves A and B of mask openings which is respectively formed densely and sparsely as shown in FIG. 6.

FIG. 7 is a diagram showing a CD-FOCUS curve A of the first mask openings 17a and a CD-FOCUS curve B of the second mask openings 17b.

The horizontal axis of FIG. 7 shows the defocus at the time of the exposure, and the best focus with no defocus can be obtained in its origin. The vertical axis shows a diameter of the windows 11a and 11b obtained by developing the exposed resist. Note that the vertical axis is normalized by the value of the best focus.

As is clear from the CD-FOCUS curve B of the sparsely-formed mask openings 17b in FIG. 7, the window 11b rapidly become narrower as the defocus becomes larger as compared with the curve A of densely-formed mask openings 17a, which indicates that the depth of focus $\Delta_1$ becomes smaller. Note that, in this specification, the depth of the focus is defined as an allowable range of the defocus that the diameter of the window becomes equals to or more than the specific value, e.g., 90%.

As can be understood from the curve A, the depth of focus $\Delta_2$ of the densely-formed mask opening 17a is larger than that of the sparsely-formed mask opening 17b.

From this finding, one may consider that, even if the mask openings 17b are sparsely formed, the mask openings 17b can artificially be dense by forming auxiliary openings around the mask openings 17b, and that the depth of focus of the mask opening 17b can be made larger. Such an auxiliary openings are called as SRAF (Sub-Resolution Assist Feature).

Figure 8:
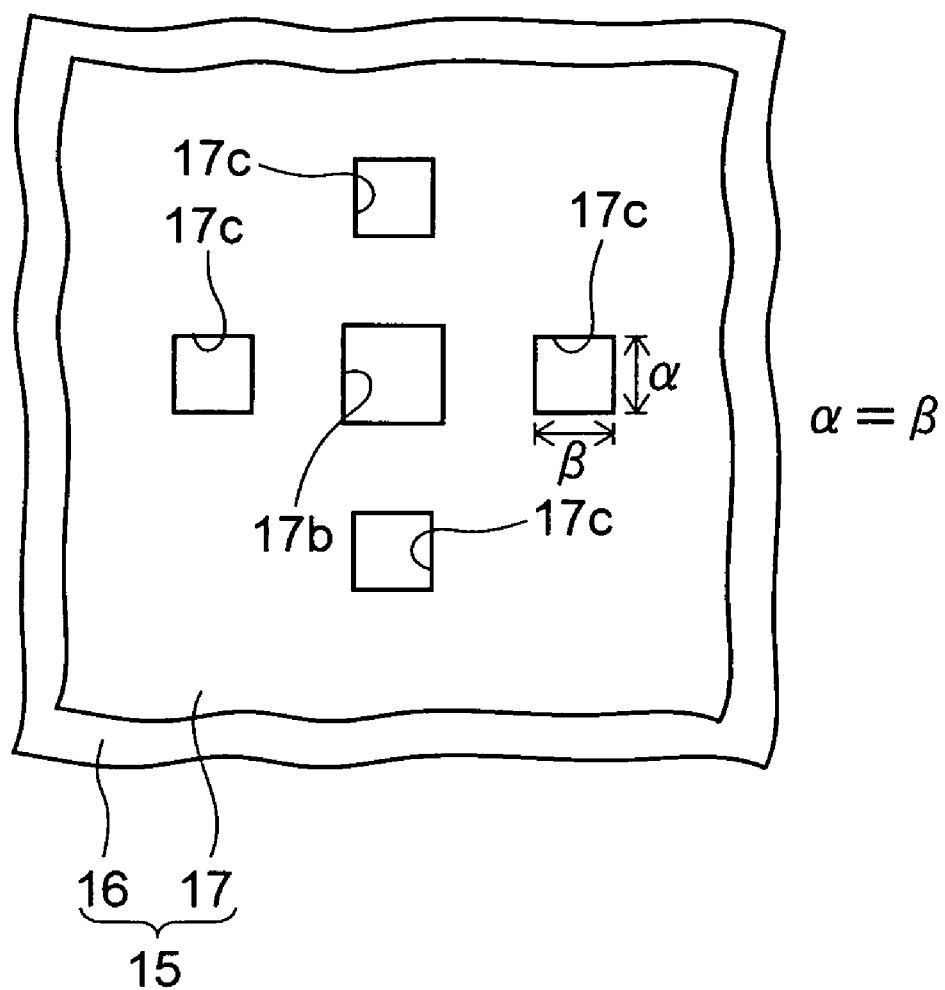
FIG. 8 is a plan view of an exposure mask in which auxiliary openings 17c are formed.

FIG. 8 is a plan view of an exposure mask 10 in which such auxiliary openings 17c are formed.

The auxiliary openings 17c are formed close to the sparsely-formed mask openings 17b. The auxiliary openings 17c have such a size that the openings 17c are not resolved in the photoresist. The shape of the auxiliary openings 17c is, for example, a rectangle in which the length of the vertical sides α are equal to the length of the horizontal sides β.

Figure 9:
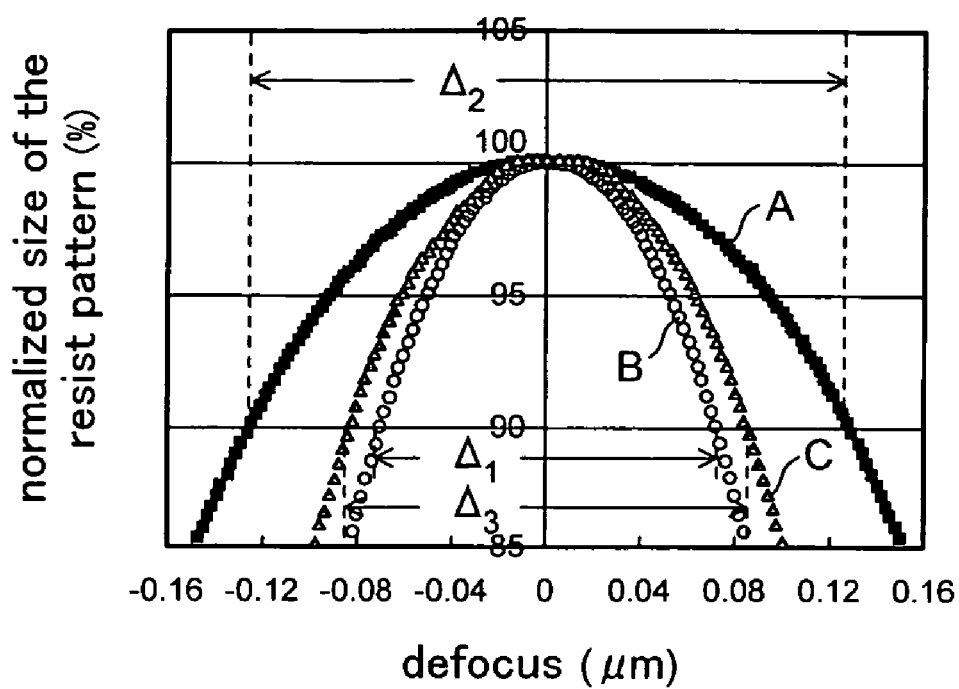
FIG. 9 is a diagram in which a CD-FOCUS curve C of the mask openings 17b with the auxiliary openings formed in their surroundings is drawn in addition to the CD-FOCUS curves A and B of FIG. 7.

FIG. 9 is a diagram showing the CD-FOCUS curve C of the mask opening 17b around which the auxiliary openings 17c are formed. In FIG. 9, CD-FOCUS curves A and B of the FIG. 7 are also shown.

As shown in FIG. 9, by forming the auxiliary openings 17c, the depth of focus $\Delta_3$ of the mask opening 17b becomes deeper than the depth of focus $\Delta_1$ of the case where the auxiliary openings 17c are not formed. Therefore, it is made possible to form the window 11b in desired sizes corresponding to the mask opening 17b even if some defocuses occur due to the factors of FIGS. 3 to 5.

However, in the case where the auxiliary openings 17c are formed in this manner, a new step is additionally needed for producing design data on the auxiliary openings 17c when the exposure mask 15 is designed. Therefore, it takes labor and time to design the exposure mask 15.

In the case where the mask openings 17b are isolated from one another as in the above, there are some spaces to form the auxiliary openings 17c around the mask opening 17b. However, in the case where the intervals between the mask patterns 17b are short, spaces for forming the auxiliary openings 17c around the mask openings 17b are insufficient, so that it is made difficult to form the auxiliary openings 17c in a desired rule.

Moreover, in recent year, the device patterns are required to be highly integrated in a manner exceeding the limitation of the resolution determined by the equation (1).

Figure 10:
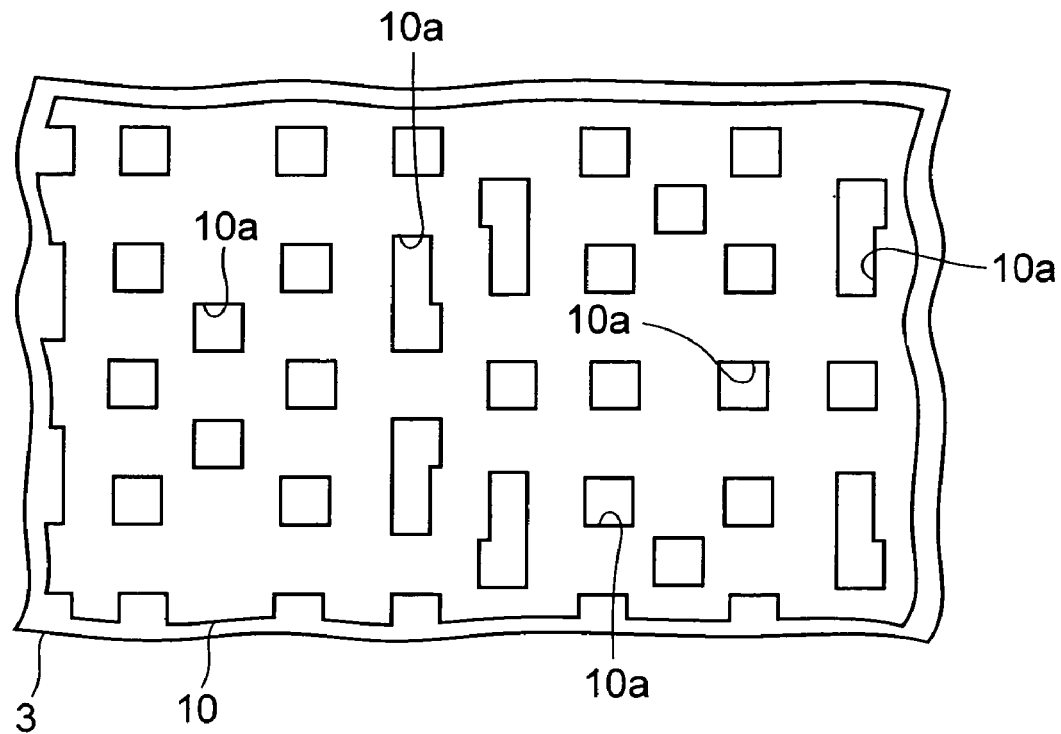
FIG. 10 is a diagram showing a layout for designing device patterns.

FIG. 10 shows design layout of the device pattern that is highly integrated in this manner. In this case, contact holes 10a formed in the interlayer insulating film 10 on the silicon substrate 3 are used for device patterns.

When a plurality of contact holes 10a are close to each other as in this case, each of projection images of the respective mask openings becomes a planar shape considerably different from the planar shape of each of the holes 10a due to an optical proximity effect, even if the mask openings in the same shape as the holes 10a are formed in the exposure mask.

To deal with this problem, a shape correction, called as OPC (Optical Proximity Correction), is usually applied to the mask openings. OPC makes the projection images of the respective mask openings equal to the design shape of the holes 10a as possible.

Figure 11:
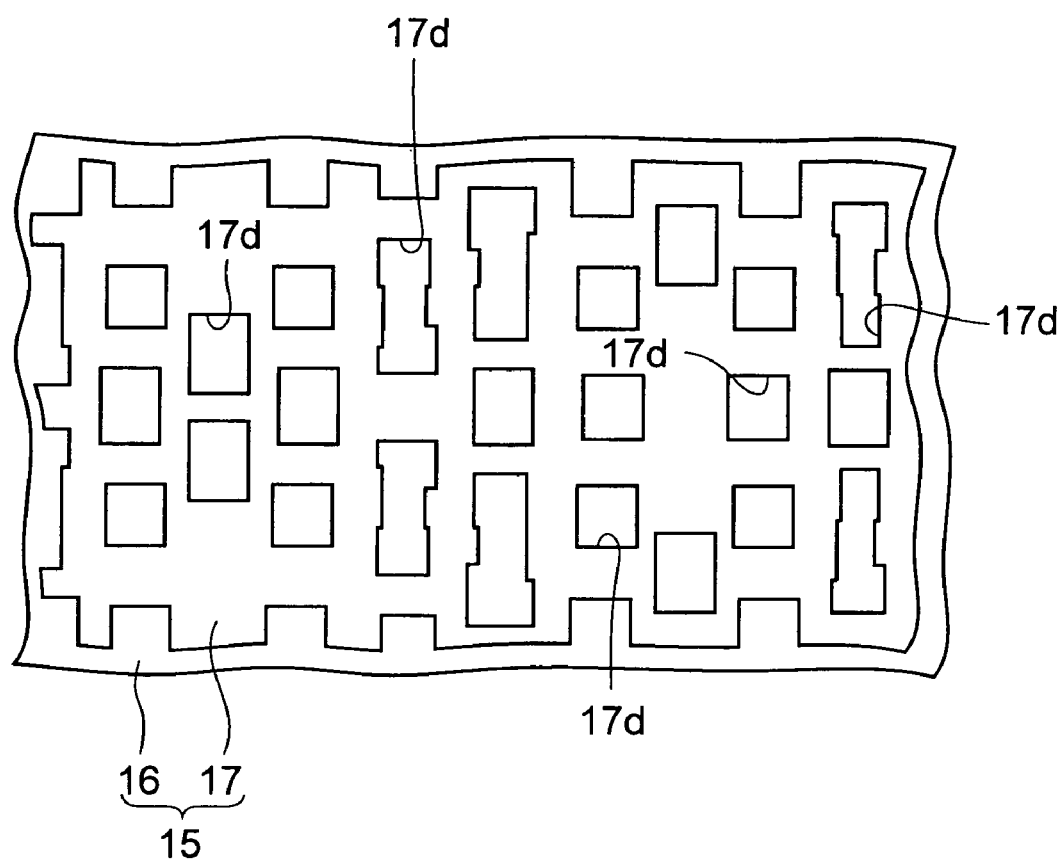
FIG. 11 is a plan view of an exposure mask including mask openings to which OPC (Optical Proximity Correction) is applied.

FIG. 11 is a plan view of an exposure mask 15 including mask openings 17d to which OPC is applied. The mask openings 17d correspond respectively to the holes 10a (see FIG. 10).

Figure 12:
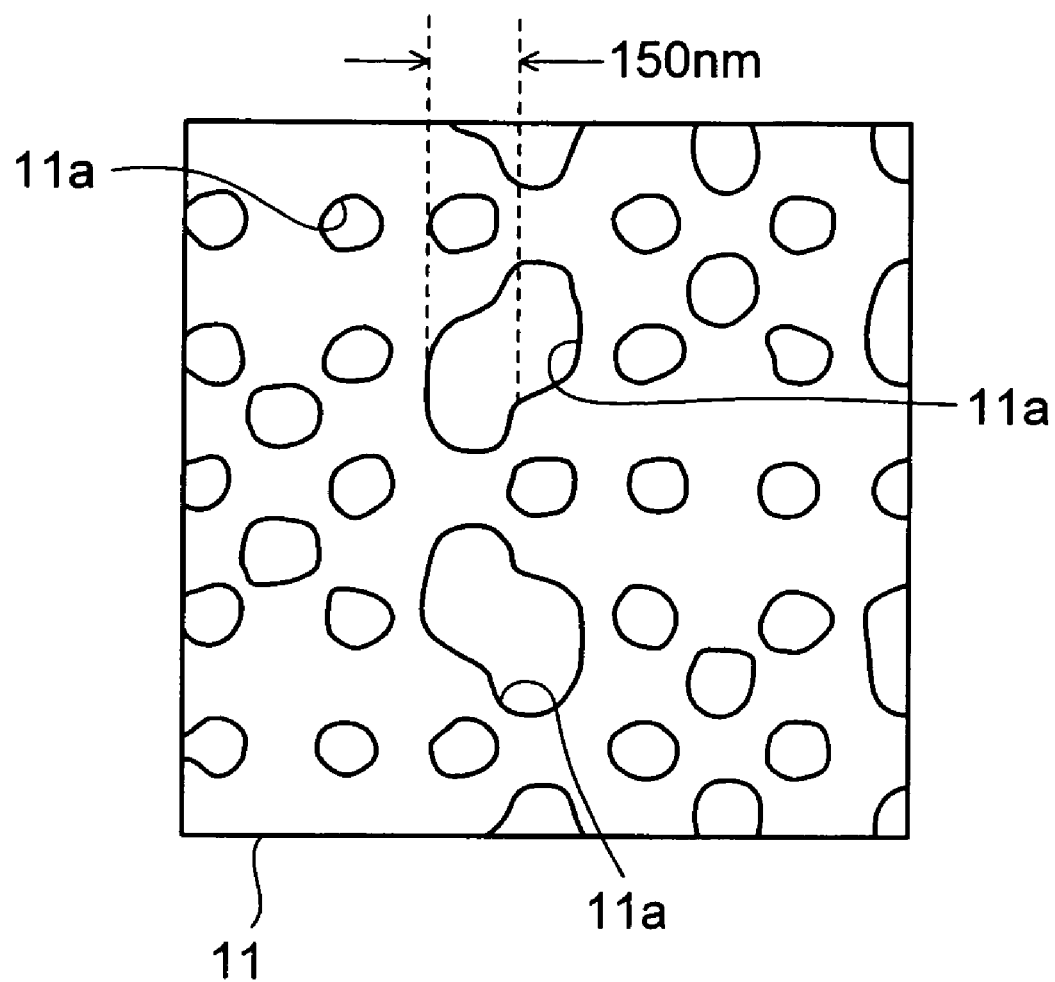
FIG. 12 is a plan view drawn based on a SEM image of the resist pattern that is formed by exposure mask shown in FIG. 11.

FIG. 12 is a plan view of a resist pattern 11 obtained by use of this exposure mask 10. This plan view is drawn based on a SEM (Scanning Electron Microscope) image of the resist pattern 11.

As shown in FIG. 12, when the device patterns are highly integrated in a manner exceeding the limitation of the resolution determined by the equation (1), the shape of the window 11a formed in the resist pattern 11 largely deviates from the design shape of the hole 10a, even if OPC is applied to the mask pattern. In this example, two windows 11a which are intended to be formed 150 nm distant away from each other are made into a single window due to the proximity effect and the resolution limit.

In addition, when the holes 10a are densely formed, there is no space to form the auxiliary openings, so that the depth of focus cannot be deepened by use of the auxiliary openings.

First Embodiment

Exposure Mask Set

Figure 13A:
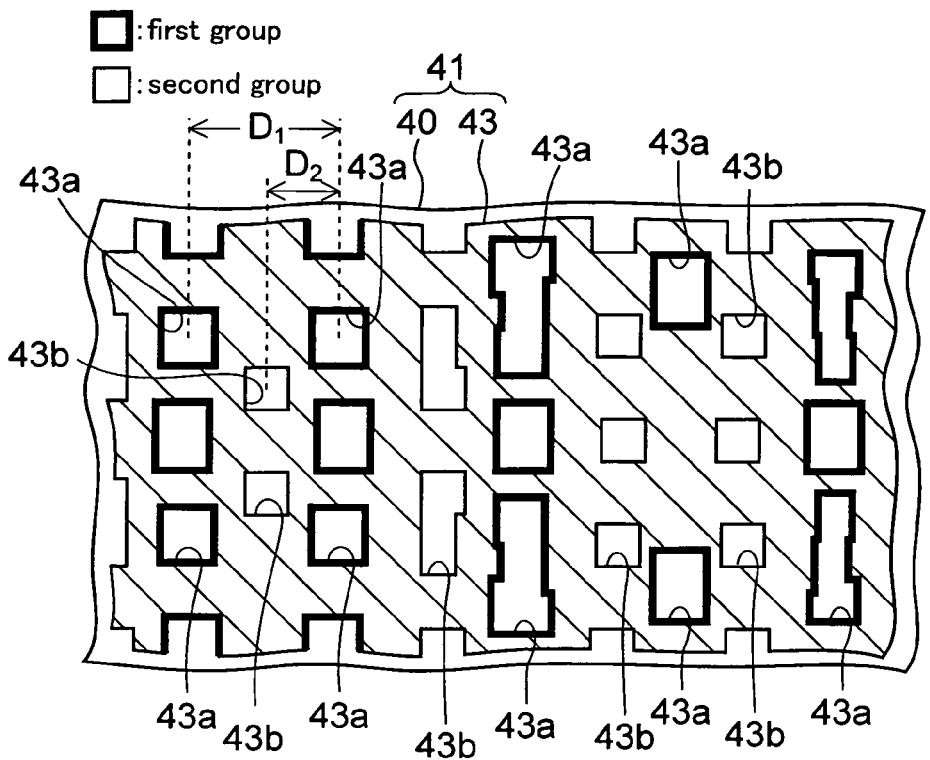
FIGS. 13A and 13B are plan views respectively of a first exposure mask and a second exposure mask which are used for the present embodiment.
Figure 13B:
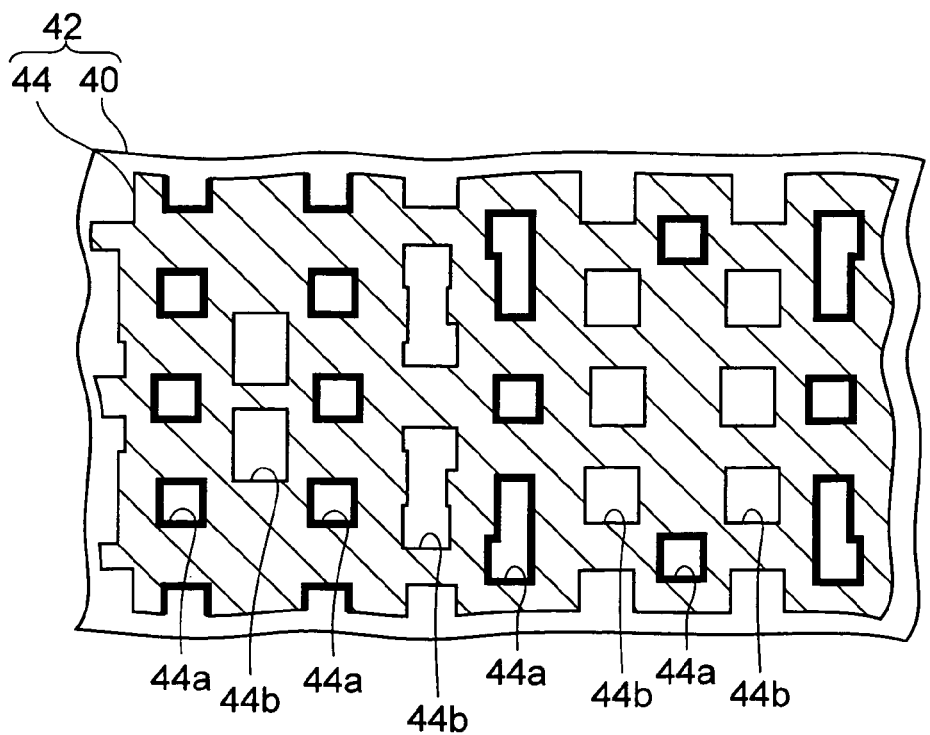

FIGS. 13A and 13B are plan views of a first exposure mask 41 and a second exposure mask 42 which are used for the present embodiment respectively.

In the present embodiment, these exposure masks 41 and 42 are used as a set for the purpose of obtaining the contact holes (device patterns) 10a shown in FIG. 10.

These exposure masks 41 and 42 are halftone masks which is advantageous for obtaining fine device patterns.

Out of the two masks, the first exposure mask 41 shown in FIG. 13A is obtained by forming a first mask pattern 43 on a transparent substrate 40 such as a quartz substrate. The first mask pattern 43 is obtained by patterning a translucent film such as a MoSi film.

A plurality of mask openings corresponding respectively to a plurality of contact holes 10a (see FIG. 10) are formed in the first mask pattern 43. The plurality of mask openings are classified into openings 43a (first mask openings) belonging to a first group and openings 43b (second mask openings) belonging to a second group. OPC is applied to only the mask openings 43a belonging to the first group. No OPC is applied to the mask openings 43b belonging to the second group.

Limitation is not imposed on how to classify the openings into the two groups. However, it is preferable that the classification be made in a way that the minimum pitches between horizontally-neighboring mask openings 43a belonging to the first group, i.e., the minimum center-to-center distances $D_1$ between horizontally-neighboring mask openings 43a, are twice as large as the minimum pitches $D_2$ between the all of the horizontally-neighboring mask openings 43a and 43b. This is also the case for the second exposure mask 42, which will be described below, as well.

On the other hand, the second exposure mask 42 shown in FIG. 13B includes a second mask pattern 44 on the transparent substrate 40. The second mask pattern 44 is obtained by patterning a translucent film, for example, a MoSi film.

Mask openings 44a belonging to the first group and mask openings 44b belonging to the second group are formed in the second mask pattern 44. The mask openings 44a and the mask openings 44b are classified respectively as the first group and the second group in the same manner as the mask openings 43a and the mask openings 43b in the first exposure mask 41. It should be noted that, unlike the first mask pattern 43, OPC is applied to the mask openings 44b (fourth mask openings) belonging to the second group in the second mask pattern 44. No OPC is applied to the mask openings 44a (third mask openings) belonging to the first group in the second mask pattern 44.

Furthermore, in the present embodiment, exposure is carried out twice by using the exposure masks 41 and 42 as described below. Therefore, the mask openings 43a and the mask openings 43b are arranged in the first exposure mask 41 in the same manner as the mask openings 44a and the mask openings 44b are arranged in the second exposure mask 42.

Note that the mask openings to which OPC is applied are 1.3 to 1.5 times as large in diameter as the mask openings to which OPC is not applied.

For this reason, the mask opening 43a belonging to the first group in the first exposure mask 41 is larger than the mask opening 44a which belong to the first group in the second exposure mask 42 and locates at the same position as the opening 43a. Similarly, the mask opening 44b belonging to the second group in the second exposure mask 42 is larger than the mask opening 43b which belongs to the second group in the first exposure mask 41 and locates at the same position as the opening 44b.

Patterning Method

Next, descriptions will be provided for a film patterning method using the foregoing exposure masks 41 and 42 by referring to FIGS. 14A to 14H.

FIGS. 14A to 14H are cross-sectional views each illustrating the film patterning method according to the present embodiment.

In the present embodiment, a resist pattern used as an etching mask is formed as follows by use of the foregoing exposure masks 41 and 42. The resist pattern is used when contact holes are formed in an interlayer insulating film.

First, descriptions will be provided for steps of forming the interlayer insulating film.

Figure 14A:
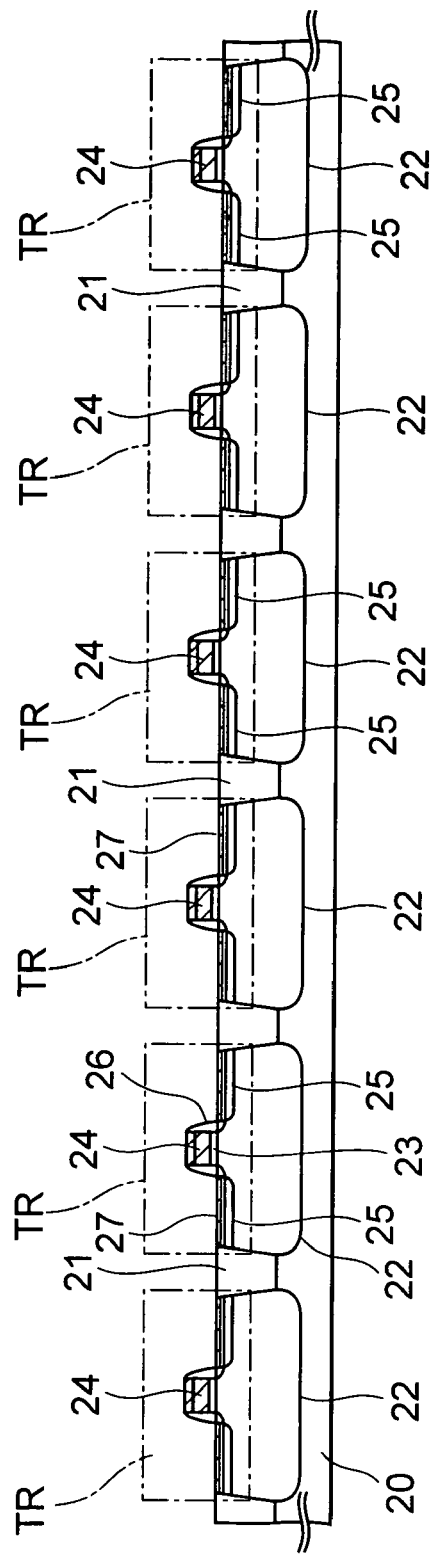
FIGS. 14A to 14H are cross-sectional views each illustrating a film patterning method according to a first embodiment of the present invention.

Firstly, as shown in FIG. 14A, device isolation insulating film 21, such as silicon oxide films, is formed in grooves of a silicon (semiconductor) substrate 20. Subsequently, p wells 22 are formed in active regions defined by the device isolation insulating film 21 in the silicon substrate 20.

Thereafter, the surface of the silicon substrate 20 is thermally oxidized, and thus thermal oxidation films which will serve as gate insulating films 23 are formed. Subsequently, gate electrodes 24 made of polysilicon are formed on the gate insulating films 23. Afterward, an insulating film, such as a silicon oxide film, is formed on an entire upper surface of the silicon substrate 20. Thereafter, this insulating film is etched back, and thus parts of the insulating film are left at the sides of the gate electrodes 24 as insulating side walls 26.

Then, ions of n impurity are implanted into the silicon substrate 20 by using the gate electrodes 24 as masks. Thereby, n source/drain regions 25 are formed.

Subsequently, a refractory metal layer, such as a cobalt layer, is formed on an entire upper surface of the silicon substrate 20 by sputtering. Then, the refractory metal layer is annealed to be reacted with silicon, so that refractory metal silicide layers 27 are formed on the source/drain regions 25. Subsequently, unreacted refractory metal layer on the device isolation insulating film 21 and the like are removed by wet etching.

Through the foregoing step, MOS transistors TR each constructed from a gate electrode 24, source/drain regions 25 and the like are formed on the silicon substrate 20 in an integrated manner.

Figure 14B:
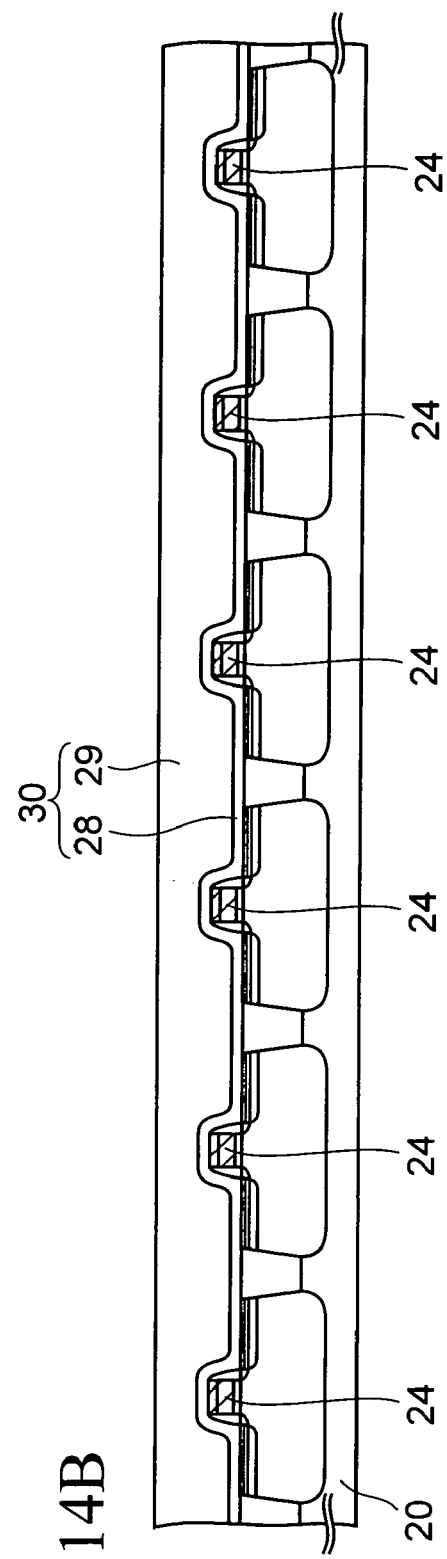

Subsequently, as shown in FIG. 14B, a silicon nitride film is formed on an entire upper surface of the silicon substrate 20 as a cover insulating film 28 by CVD (Chemical Vapor Deposition) method. Thereafter, a silicon oxide film is formed on the cover insulating film 28 by CVD method as a planarizing film 29. After that, the upper surface of the planarizing film 29 is polished and planarized by CMP (Chemical Mechanical Polishing) method.

Through the foregoing step, an interlayer insulating film 30, which is to be patterned, is constructed from the insulating films 28 and 29.

Figure 14C:
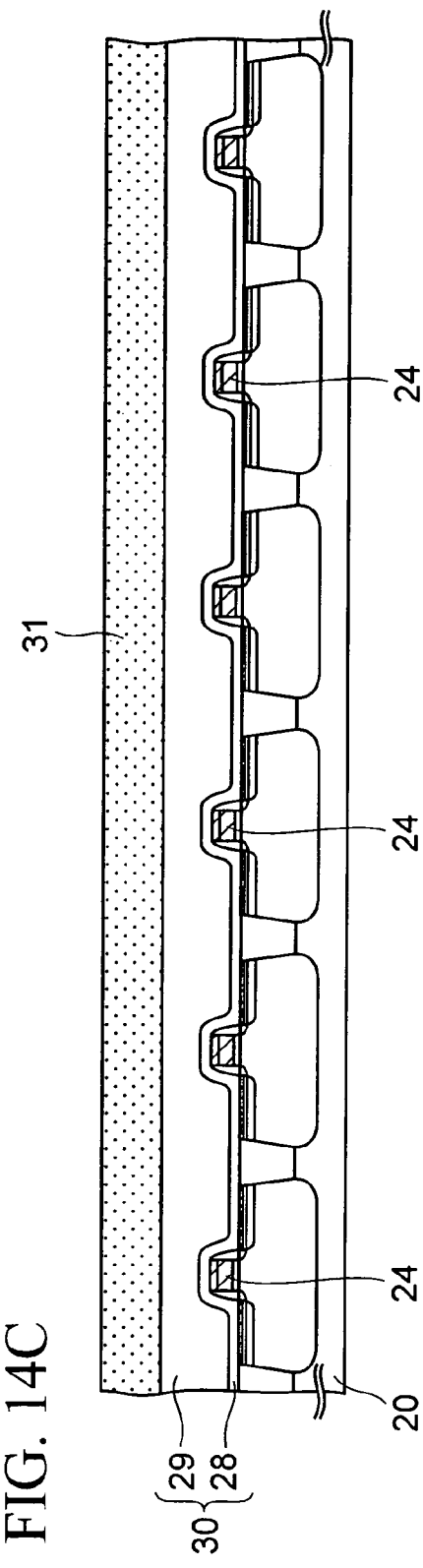

Subsequently, as shown in FIG. 14C, a chemically amplified photoresist of positive type 31 is applied to the upper surface of the interlayer insulating film 30 by spin coating. It should be noted that BARC (Bottom Antireflective Coating) may be applied, as an antireflective film for preventing exposure light from being reflected, to the upper surface of the interlayer insulating film 30 before applying the photoresist 31 thereto.

Figure 14D:
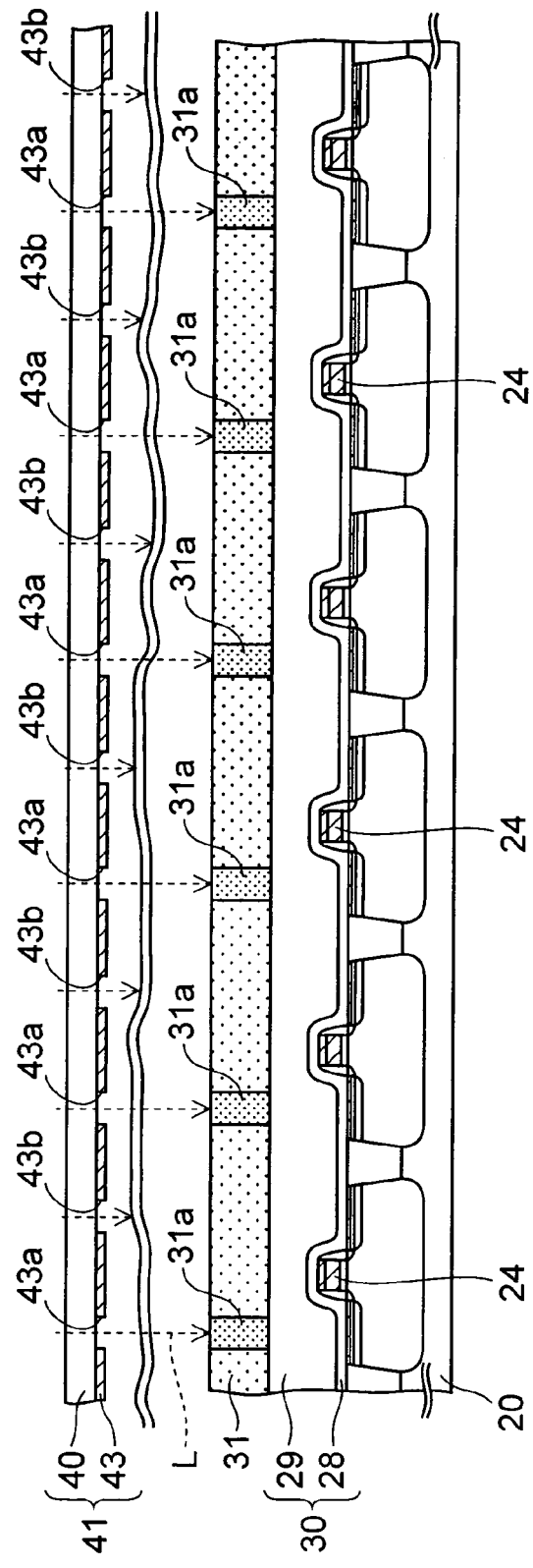

Next, as shown in FIG. 14D, the photoresist 31 in a chip region is exposed by use of the first exposure mask 41, which is explained in FIG. 13A, in an exposure system such as a stepper. In this exposure, ArF laser light is used as exposure light L.

By such exposure, the first mask pattern 43 is projected on the photoresist 31. Thus, the mask openings 43a belonging to the first group to which OPC is applied form their images on the photoresist 31. As a result, first exposed portions 31a corresponding to the mask openings 43a are formed in the photoresist 31.

In this exposure, the mask openings (second mask openings) 43b, belonging to the second group to which OPC is not applied, function as auxiliary openings (assist patterns) for the mask openings 43a belonging to the first group to which OPC is applied. Therefore, the depth of focus of the first exposure mask 41 becomes deeper than the case where the mask openings 43b are absent. Accordingly, it is made possible to form the first exposed portions 31a with a diameter nearly equal to a designed value, even if a slight defocus occurs due to any one of the factors of FIGS. 3 to 5.

Because of the optical proximity effect, the mask openings 43b, belonging to the second group to which OPC is not applied, do not form their images on the photoresist 31 or, even if the images of the openings 43b is formed, their images is deformed to be smaller than the case where OPC is applied to the openings 43b.

Figure 14E:
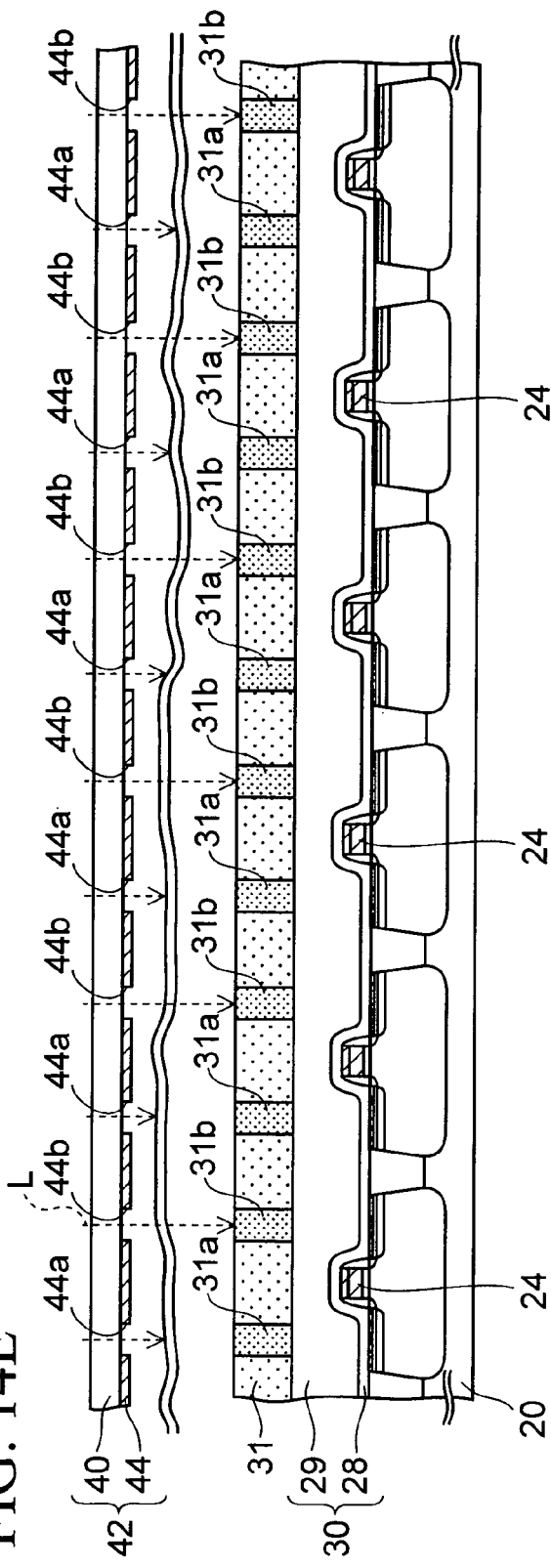

Subsequently, as shown in FIG. 14E, the photoresist 31 is exposed by use of the second exposure mask 42 (see FIG. 13B) in the exposure system, such as a stepper, which uses ArF laser light as exposure light L. In this exposure, the photoresist in the same chip region as in the first exposure (see FIG. 14D) is exposed.

Through such exposure, the second mask pattern 44 is projected on the photoresist 31. Thus, the mask openings 44b, belonging to the second group to which OPC is applied, form their images on the photoresist 31. Hence, second exposed portions 31b corresponding to the mask openings 44b are formed in the photoresist 31.

In this step, the mask openings (third mask openings) 44a, belonging to the first group to which OPC is not applied, function as the auxiliary openings (assist patterns) for the mask openings 44b belonging to the second group to which OPC is applied. Therefore, it is made possible to make the depth of focus of the second exposure mask 42 deeper. As a result, the second exposed portions 31b can be formed to have a diameter nearly equal to a design value, even if some defocus occurs.

Note that since OPC is not applied to the mask openings 44a belonging to the first group, images of the mask openings 44a deforms due to the optical proximity effect. As a result, mask openings 44a do not form their images on the photoresist 31 or, even if the images of the openings 44a is formed, their images become smaller than the first exposed portions 31a, so that the first exposed portions 31a do not become larger than the designed value during the above two exposures.

For the same reason, even if the mask openings 43b, belonging to the second group to which OPC is not applied, form their images on the photoresist 31 during the previous exposure (see FIG. 14D), their images become small due to the optical proximity effect. Hence, the portions of the photoresist 31, where the images of the mask opening 43b is formed, is included in the second exposed portions 31b, so that the unnecessary exposed portions are not formed in the photoresist 31.

Thereafter, the photoresist 31 is baked. This bakes is called as PEB (Post-Exposure Baking), and is carried out for the purpose of accelerating generation of acid in the exposed portions 31a and 31b.

Figure 14F:
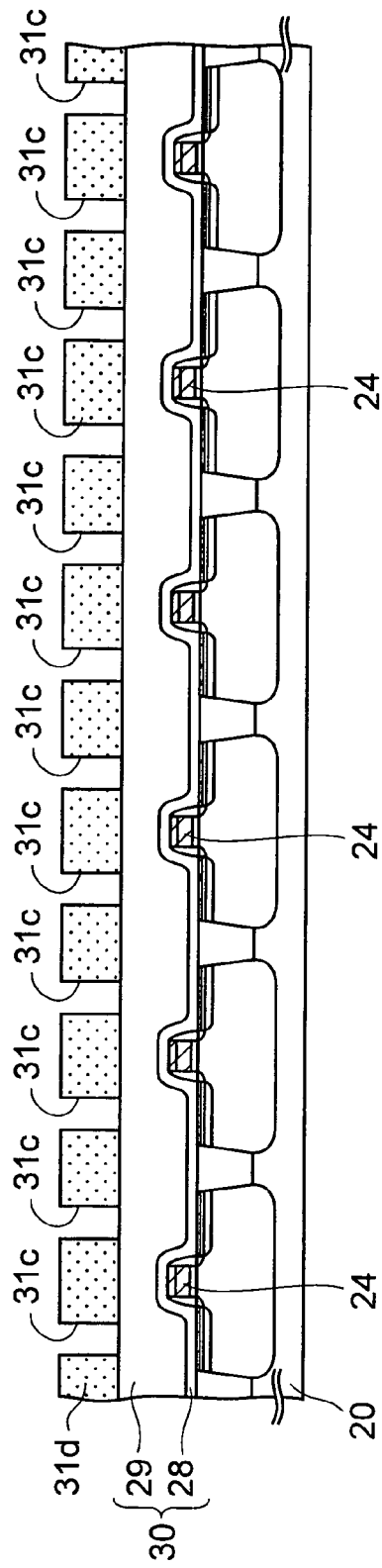

Subsequently, as shown in FIG. 14F, the photoresist 31 is developed to remove the exposed portions 31a and 31b in which the acid exists, so that windows 31c of hole shape are formed. Further, portions of the photoresist 31, which is not removed in this process, is used as a resist pattern 31d.

Figure 14G:
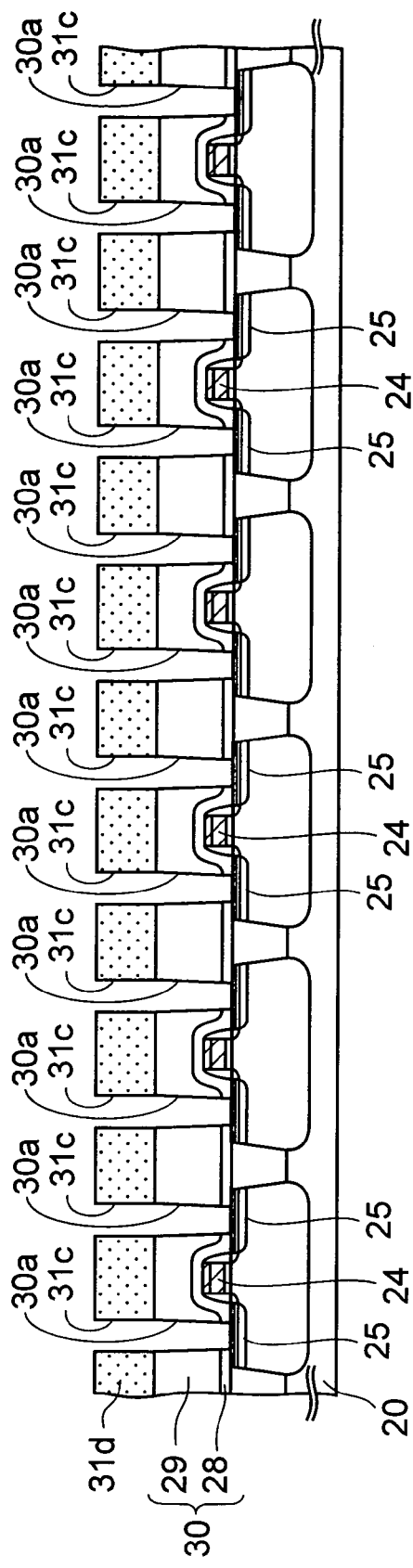

Next, as shown in FIG. 14G, the interlayer insulating film 30 is dry-etched by using the resist pattern 31d as a mask. Thus, contact holes 30a, each with a depth reaching the source/drain region 25, are formed.

Although the diameters of the contact holes (first and second device patterns) 30a is not particularly limited, the diameters are approximately 80 nm to 100 nm in the present embodiment.

Thereafter, the resist pattern 31d is removed.

By these steps, essential steps of the patterning method according to the present embodiment are completed.

Figure 14H:
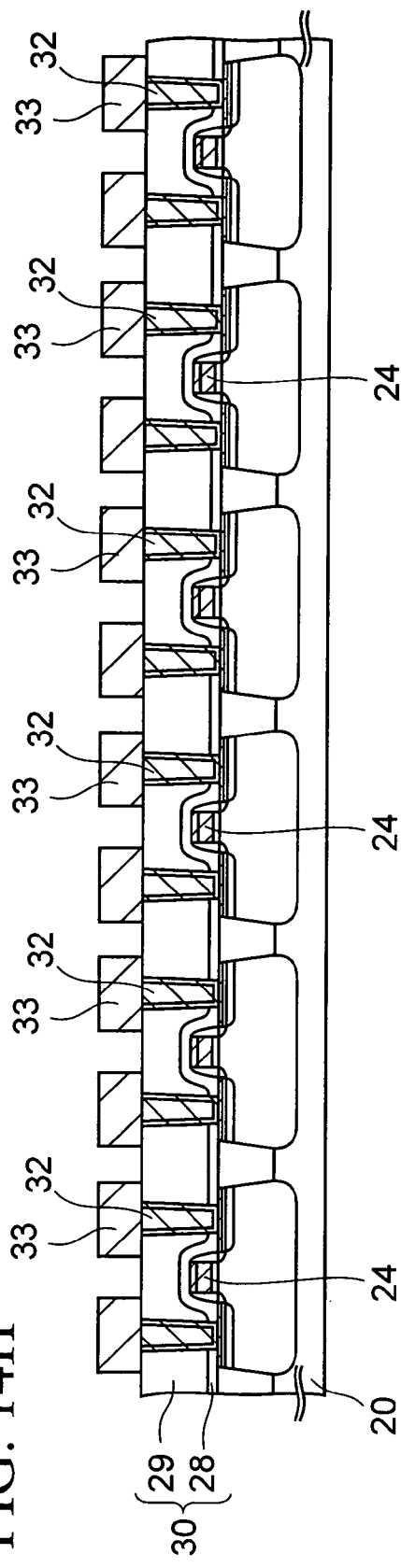

After these steps, step of forming contact plugs 32 and metal interconnects 33 is performed as shown in FIG. 14H.

In this step, a titanium film and a titanium nitride film are sequentially formed as a glue film by sputtering on the inner surface of the contact holes 30a and on the upper surface of the interlayer insulating film 30. Subsequently, a tungsten film is formed on the glue film by CVD, and the contact holes 30a are completely filled with the tungsten film. Thereafter, excessive glue film and the tungsten film on the interlayer insulating film 30 are polished and removed by CMP. Thus, the glue film and the tungsten film are left in the contact holes 30a as contract plugs 32.

Thereafter, a metal laminated film including an aluminum film is formed on the contact plugs 32 and on the interlayer insulating film 30 by sputtering. Subsequently, this metal laminated film is patterned, and thus the metal interconnects 33 are formed.

Through the foregoing steps, semiconductor device, which includes the transistor TR and interconnects electrically connected to the transistors TR, is completed.

In the present embodiment, the photoresist 31 is exposed twice by use of the first exposure mask 41 and the second exposure mask 42, as explained by referring to FIGS. 14D and 14E.

In the first exposure (see FIG. 14D) using the first exposure mask 41, the mask openings 43b, belonging to the second group to which OPC is not applied, function as the auxiliary openings for the mask openings 43a belonging to the first group to which OPC is applied. Therefore, it is made possible to make the depth of focus of the first exposure mask 41 deeper.

Moreover, according to this method, OPC is intentionally not applied to the mask openings 43b belonging to the second group which are formed for originally forming the contact holes 30a, and the mask openings 43b are used as the auxiliary openings. As a result, there is no need to newly form some auxiliary openings. Therefore, it is made possible to make the depth of focus of the first exposure mask 41 deeper by the mask openings 43b, even in the case where the exposure mask has no space available for forming new auxiliary openings, as in the case where the contact holes 30a are formed densely.

Such an advantage can be obtained particularly in the case where an interval between two adjacent contact holes (first and second device patterns) 30a is not longer than 150 nm.

Furthermore, the minimum pitches $D_1$ between the mask openings 43a belonging to the first group to which OPC is applied are larger than the minimum pitches $D_2$ between the mask openings 43a and the mask openings 43b. Therefore, precision of the OPC can be improved than the case where the OPC is collectively applied to the openings 43a and 43b, even when the pitches between the contact holes 30a are smaller beyond the limit of the resolution determined by Equation (1). Thus, shape of the contact holes 30a can be made close to the designed planer shape.

Figure 15:
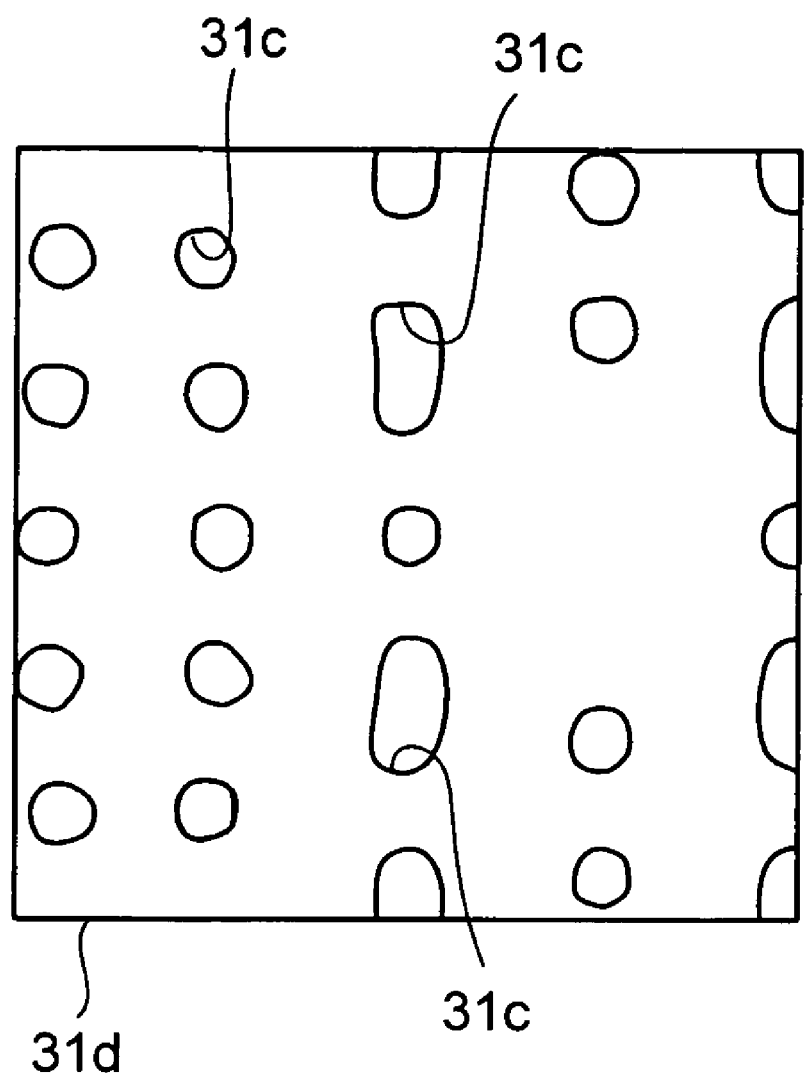
FIG. 15 is a plan view drawn based on a SEM image of a resist pattern that is obtained in an exposing step using only a first exposure mask.

FIG. 15 is a plan view of the resist pattern 31d obtained by exposing the resist pattern 31d by use of only the first exposure mask 41. This plan view is drawn based on an SEM image of the resist pattern 31d.

As is clear from FIG. 15, since the precision of OPC is improved, window 31c is not largely deformed by the optical proximity effect, so that the shape of the window 31c is made closer to the designed shape than the case of FIG. 12.

For the same reason, in the second exposure (see FIG. 14E) using the second exposure mask 42, the depth of focus of the second exposure mask 42 can be deepened without forming new auxiliary openings, and precision of OPC can be improved.

Figure 16:
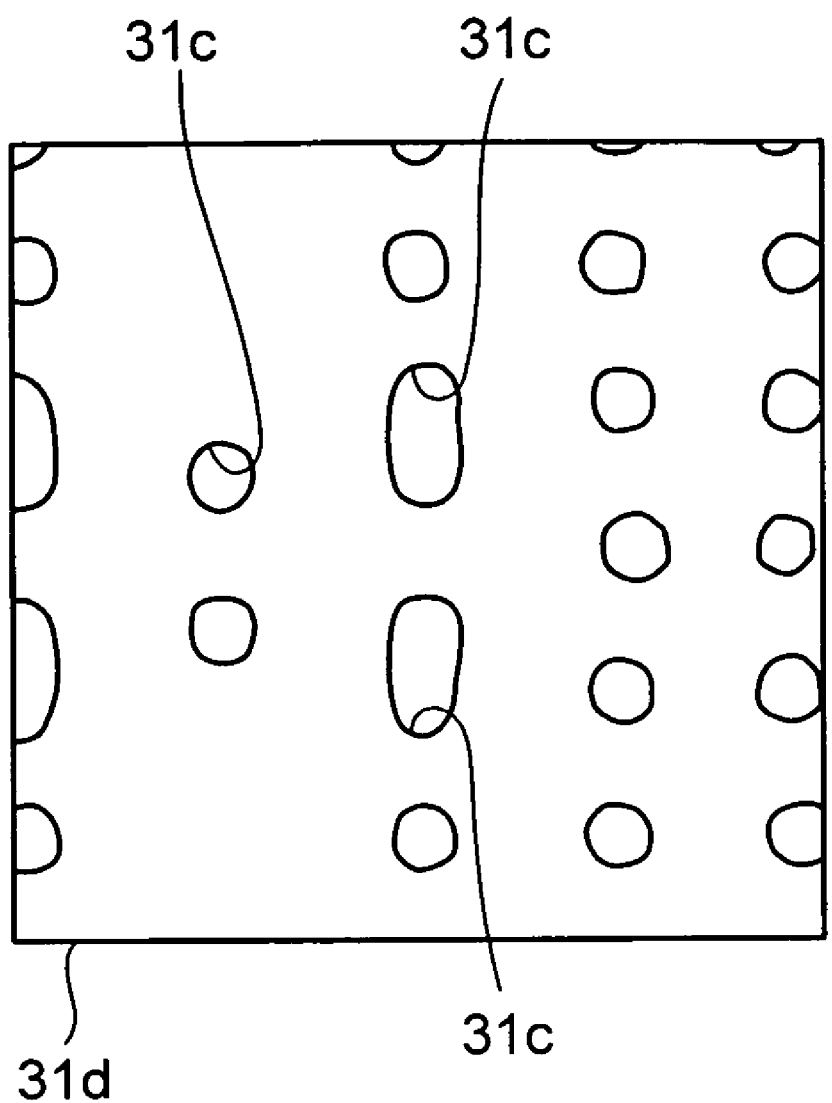
FIG. 16 is a plan view drawn based on a SEM image of a resist pattern that is obtained in an exposing step using only a second exposure mask.

FIG. 16 is a plan view of the resist pattern 31d obtained by exposing the resist pattern 31d by use of only the second exposure mask 42. The plan view is drawn based on a SEM image of the resist pattern 31d.

As shown in FIG. 16, since the precision of OPC for the second exposure mask 42 is improved, deformation of the window 31a due to the optical proximity effect does not generate.

Figure 17:
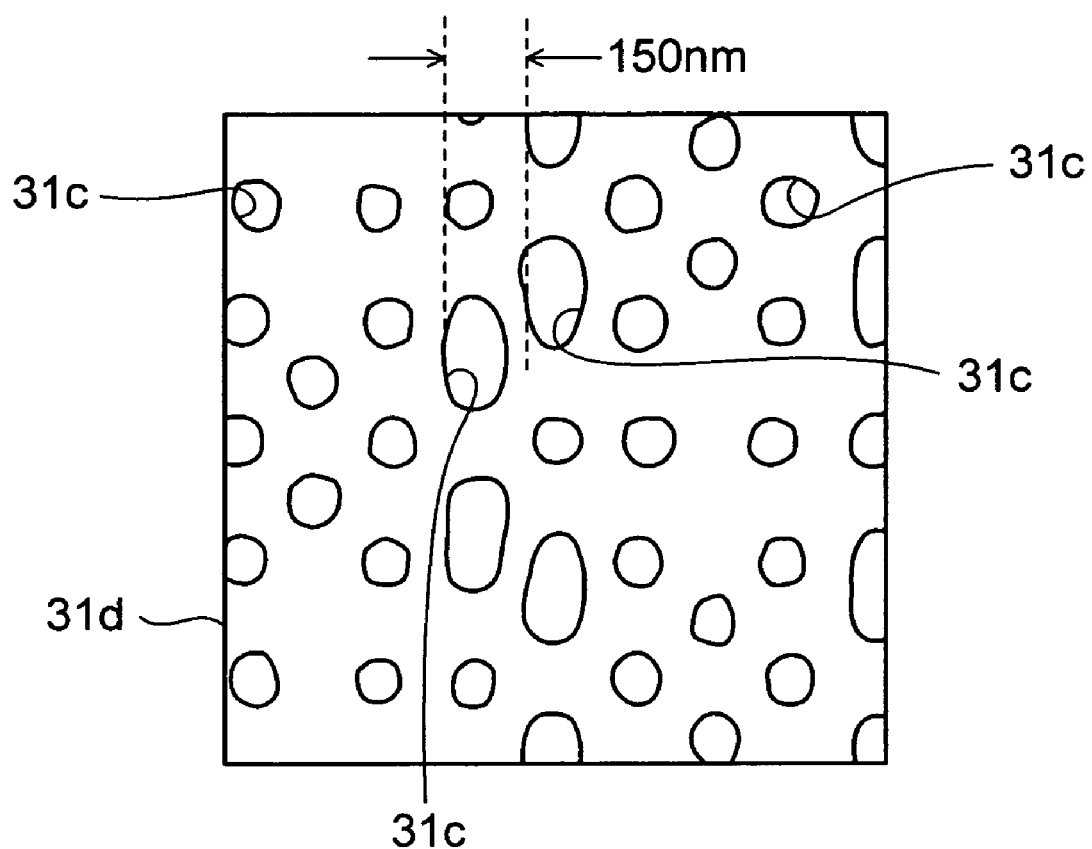
FIG. 17 is a plan view drawn based on a SEM image of a resist pattern that is obtained in a double exposing step using the first and second exposure mask.

FIG. 17 is a plan view of the resist pattern 31d obtained by exposing the resist pattern 31d twice by use of the first exposure mask 41 and the second exposure mask 42 as in the present embodiment. The plan view is drawn based on a SEM image of the resist pattern 31d.

As can be understood by comparing FIG. 17 and FIG. 12, pattern deformation due to the optical proximity effect is significantly improved in the present embodiment. Although two adjacent windows 11a are jointed in FIG. 12, they can be separately formed in the present embodiment as shown in FIG. 17.

Dose amounts in the first exposure (see FIG. 14D) and the second exposure (see FIG. 14E) are not particularly limited. However, in order to avoid the overdose by the double exposure, it is preferable to set the dose amounts in the respective exposure to the half of the does that is required for exposing the photoresist by using the exposure mask 10 (see FIG. 11) in a single exposure step.

Method of Manufacturing an Exposure Mask

Descriptions will be provided next for a method of manufacturing the first exposure mask 41.

Figure 18:
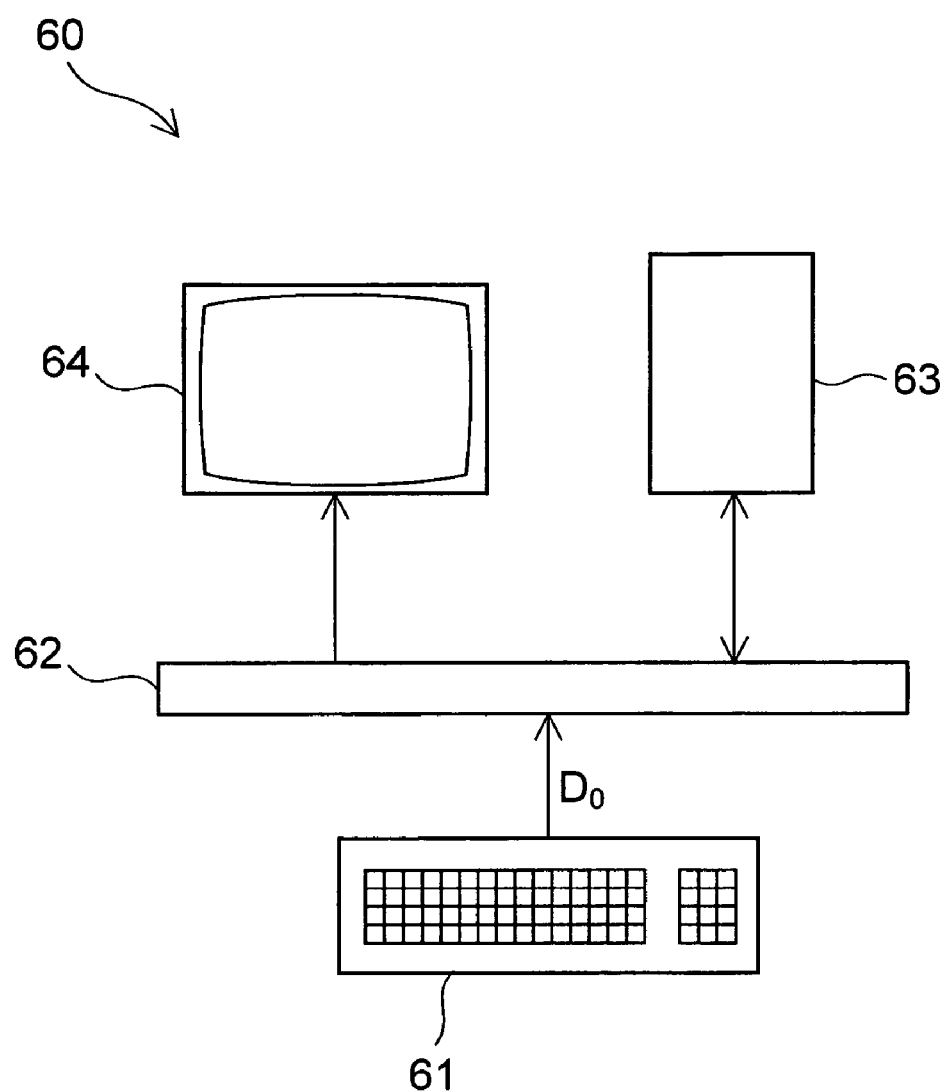
FIG. 18 is a diagram of a configuration of a design system used for designing an exposure mask in any one of the embodiments of the present invention.

FIG. 18 is a block diagram of a design system used for designing the first exposure mask 41. The design system 60 includes an input unit 61 and a display unit 64. The input unit 61 is used to input design data $D_0$ on the plurality of contact holes 30a and the like into the design system 60 by an operator, and examples of the input unit 61 include a keyboard. The display unit 64 virtually displays the mask openings 43a and 43b of the exposure masks, and examples of the display unit 64 include a monitor. A bus 62 is connected to the input unit 61 and the display unit 64. Data is sent and received by the input unit 61 and the display unit 64 through the bus 62.

In addition, a control unit 63 such as a CPU is connected to the bus 62. The control unit 63 has a function of correcting the design data on the mask openings 43a and 43b by applying OPC to the design data $D_0$ on the contact holes 30a.

Figure 19:
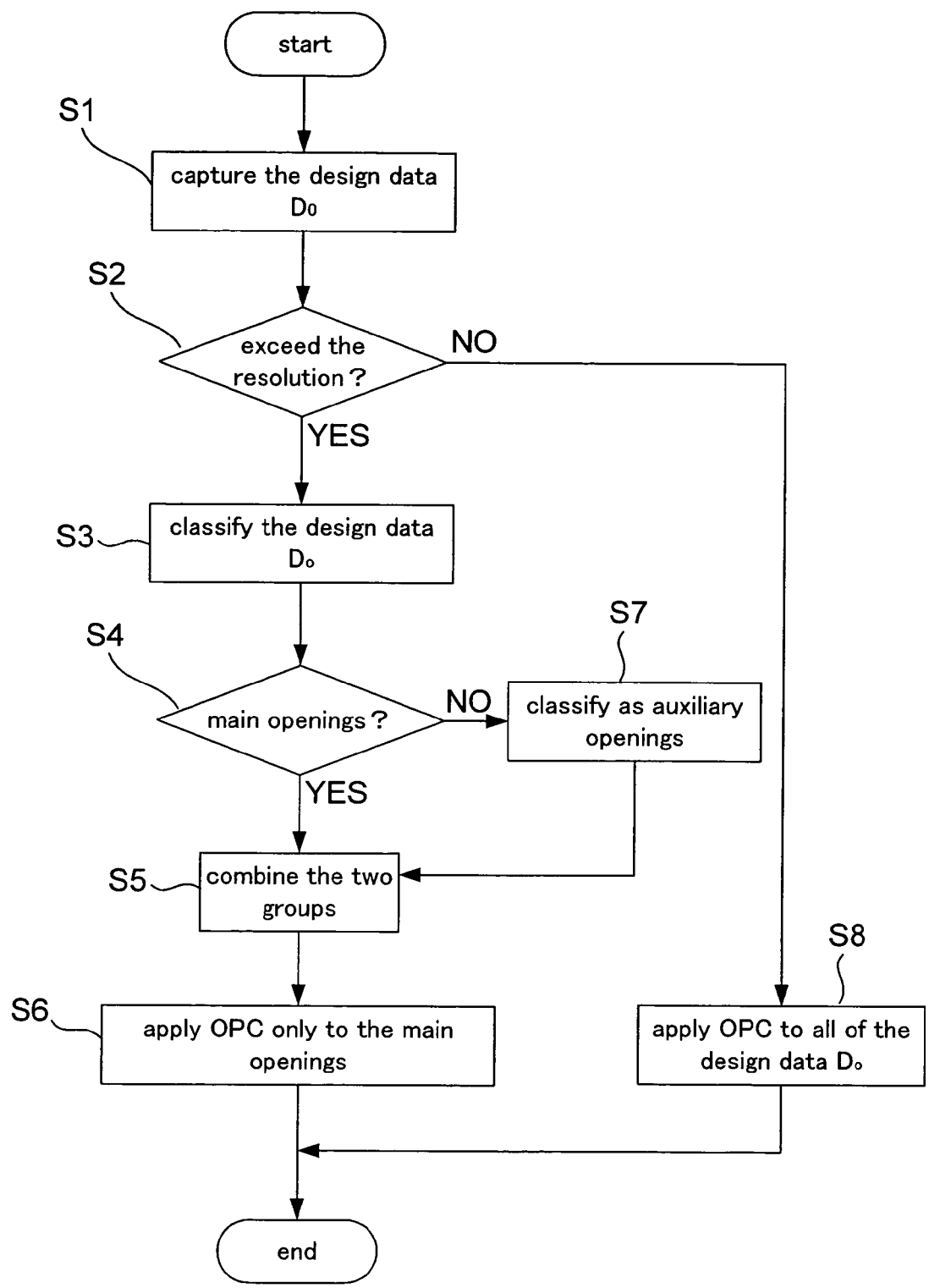
FIG. 19 is a flowchart illustrating a method of designing an exposure mask according to the first embodiment of the present invention.

FIG. 19 is a flowchart showing a method of designing the first exposure mask 41 which is carried out by use of this design system 60.

In a first step S1 shown in FIG. 19, the operator operates the input unit 61. Thereby, the design data $D_0$ on the plurality of contact holes 30a is captured into the system 60.

In the following step S2, it is judged whether or not the pitch between two adjacent contact holes 30a exceeds the resolution of the exposure system which is determined by Equation (1).

This judgment is made by judging whether or not constant $k_1$ of Equation (1) is smaller than a predetermined value. Note that constant $k_1$ is determined by the material of the photoresist and the exposure condition. In the current exposure system, the predetermined value is approximately 0.35, and hence the pitch is judged as exceeding the resolution if the constant $k_1$ is smaller than 0.35.

If it is judged that the pitch between the two adjacent contact holes 30a exceeds the resolution (YES), the process proceeds to step S3, where design data $D_0$ on the contract holes 30a is classified into the first group and the second group.

Classification is not particularly limited. It is desirable, however, that the classification be made in a manner that the minimum pitches between the contact holes 30a belonging to the first group are twice as large as the minimum pitches between all of the contact holes 30a. OPC software includes parameters for determining the minimum pitches between the holes. Therefore, if the operator sets up the parameters adequately, the above classification can be made by use of the foregoing pitches.

Subsequently, the process proceeds to step S3, where it is judged whether a contact hole 30a located in the left end in an exposure area belongs to the first group or the second group. Furthermore, it is determined that the group, to which the left end contact hole 30a belongs, is determined as main openings. That is, data on the main openings is determined as data to which OPC is to be applied.

On the other hand, group of openings, which are not classified as the main openings, is classified in step S7 as a group of auxiliary openings for making the depths of focus of the main openings deeper.

Subsequently, the process proceeds to step S5, where the classified two groups are combined.

Thereafter, the process proceeds to step S6, where OPC is applied only to design data $D_0$ belonging to the group of openings classified as the main openings, and thus corrected design data $D_c$ is obtained. It should be noted that OPC is not applied to design data $D_0$ belonging to the group of openings which are classified as the auxiliary openings.

This process is not intended to ignore the group of openings which are classified as the auxiliary openings. Rather, this process is intended to apply OPC only to the design data $D_0$ belonging to the group of openings classified as the main openings, by taking into consideration of the existence of the group of openings classified as the auxiliary openings, i.e., by taking into consideration of the influence of exposure light passed through the auxiliary openings on exposure light passed through the main openings. Such OPC can be executed in OPC software by making such a setting that shape and size of the mask openings, which belongs to the group classified as auxiliary openings, are to be not changed.

On the other hand, if it is judged in step S2 that the pitch between the two adjacent contact holes 30a does not exceed the resolution of the exposure system which is determined by Equation (1) the process proceeds to step S8.

In this case, the design data $D_0$ is not classified as in the above, and OPC is collectively applied to the all of the design data $D_0$.

With the foregoing step, the predetermined process to be applied to the design data $D_0$ needed for manufacturing the first exposure mask 41 is completed.

Descriptions will be provided next for a method of manufacturing the first exposure mask 41 using the corrected design data $D_c$ which is obtained in the foregoing manner.

Figure 20:
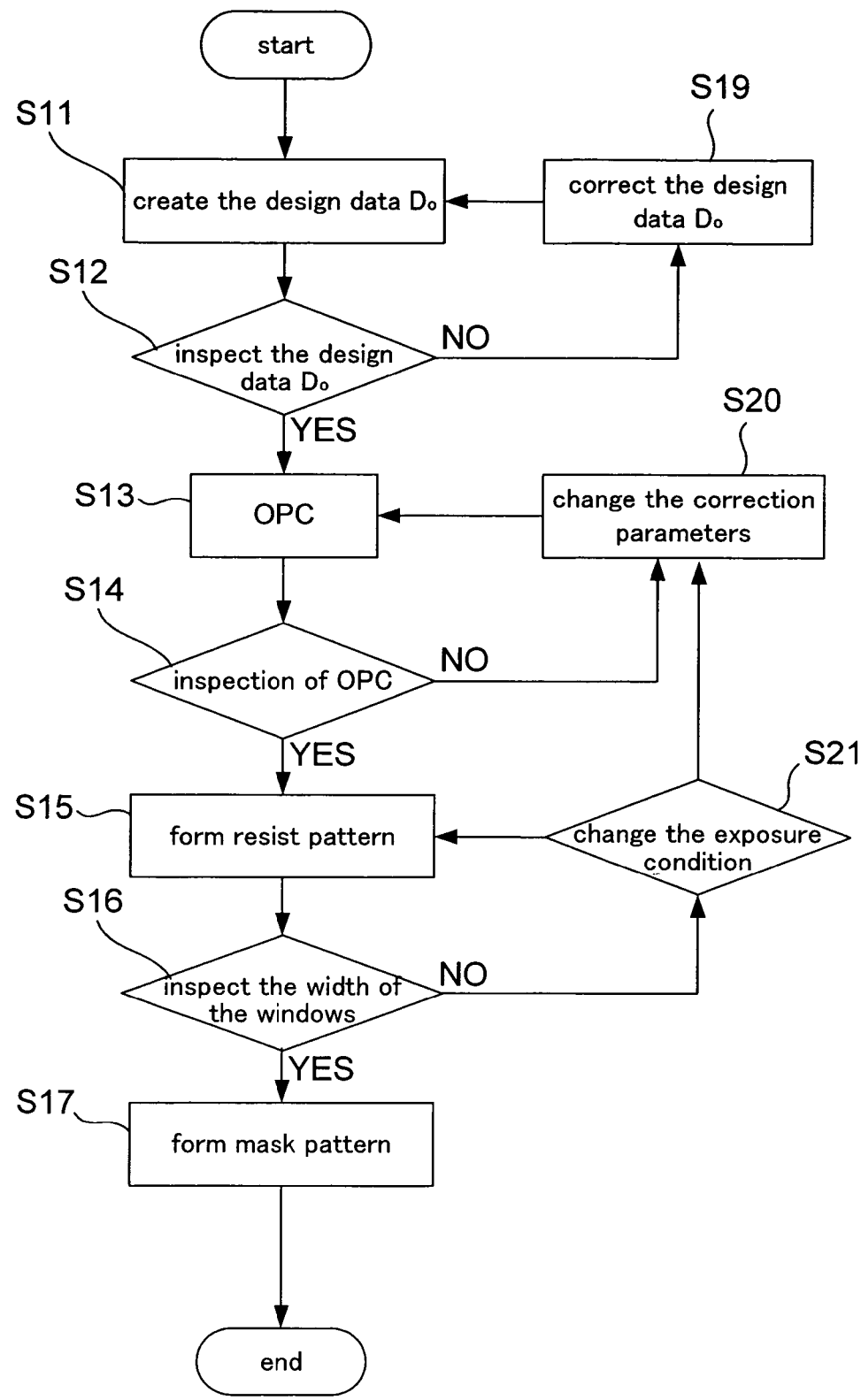
FIG. 20 is a flowchart illustrating a method of manufacturing an exposure mask according to the first embodiment of the present invention.

FIG. 20 is a flowchart illustrating a method of manufacturing the first exposure mask 41.

It should be noted that steps S11, S12 and S19 in FIG. 20 are steps residing in upper stream than step S1 in FIG. 19. In addition, steps S1 to S8 in FIG. 19 corresponds to detailed steps in the step S13 in FIG. 20.

In the following, FIGS. 21A to 21D will be also referred to if necessary. FIGS. 21A to 21D are cross-sectional views each showing the exposure mask according to the present embodiment in the course of manufacturing.

In a first step S11 in FIG. 20, a designer of a semiconductor device creates the design data $D_0$ on the contact holes 30a.

Subsequently, the process proceeds to step S12, where the system 60 inspects whether or not the design data $D_0$ satisfies the design rule. This inspection is called as DRC (Design Rule Check).

Here, if it is judged that the design data $D_0$ does not satisfy the design rule (NO), the process proceeds to step S19, where the design data $D_0$ is corrected so that the design data $D_0$ can satisfy the design rule by making the pitches between the contact holes 30a wider.

On the other hand, if it is judged that the design data $D_0$ satisfies the design rule (YES), the process proceeds to step S13.

In step S13, steps S1 to S8 described by use of FIG. 18 are carried out. Thereby, in the case where it is judged that the pitches between the contact holes 30a exceed the resolution of the exposure system, OPC is applied to only the design data $D_0$ belonging to one out of the two classified groups of design data $D_0$. Thus, the corrected design data $D_c$ is obtained.

Subsequently, the process proceeds to step S14, where the system 60 inspects whether or not contact holes can be formed in an exact designed shape on the basis of the corrected design data $D_c$ which is obtained in step S13. This inspection is carried out through a simulation, and is called as ORC (Optical Rule Check).

If it is judged in this check that contact holes cannot be formed in the exact designed shape (NO), the process proceeds to step S20, where correction parameters used in the OPC process in step S6 or S8 (see FIG. 19) are changed. Subsequently, step S13 is carried out again.

On the other hand, if it is judged that the contact holes can be formed in the exact designed shape (YES), the process proceeds to step S15.

Figure 21A:
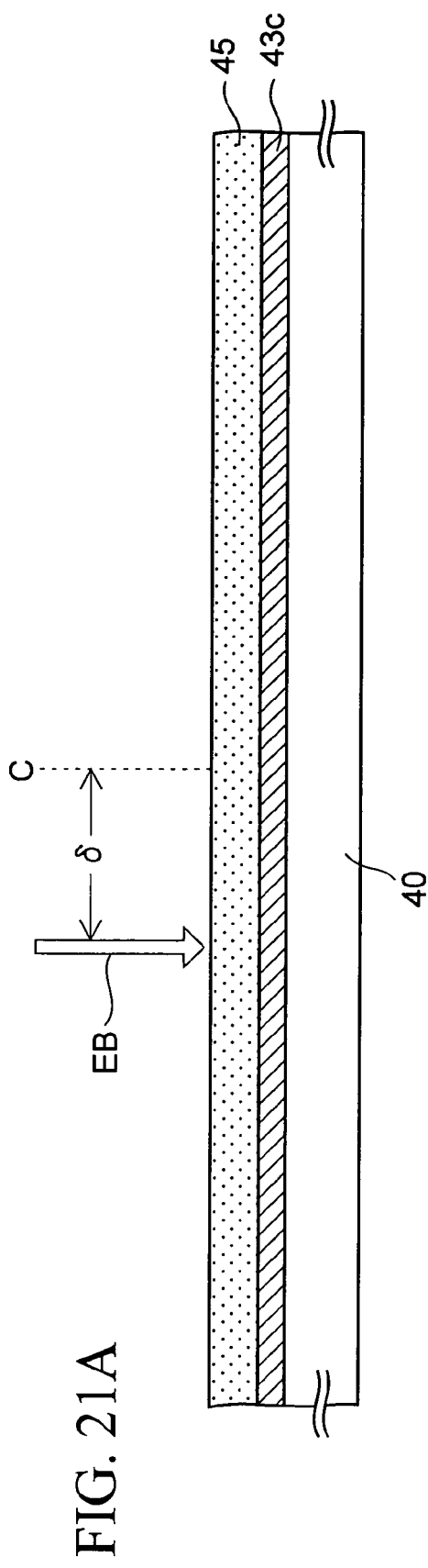

In step S15, as shown in FIG. 21A, an electron-beam resist 45 is applied on a translucent film 43c formed on the transparent substrate 40. Examples of the translucent film 43c include a MoSi film. Thereafter, the resultant transparent substrate 40 is placed in an electron-beam exposure system (not shown). Subsequently, the foregoing corrected design data $D_c$ is inputted to a control system of the electron-beam exposure system. On the basis of the corrected design data $D_c$, the electron-beam exposure system calculates a deflection amount δ of a electron beam EB from the optical axis C. Then the electron-beam resist 45 is exposed by the deflected electron beam EB.

Figure 21B:
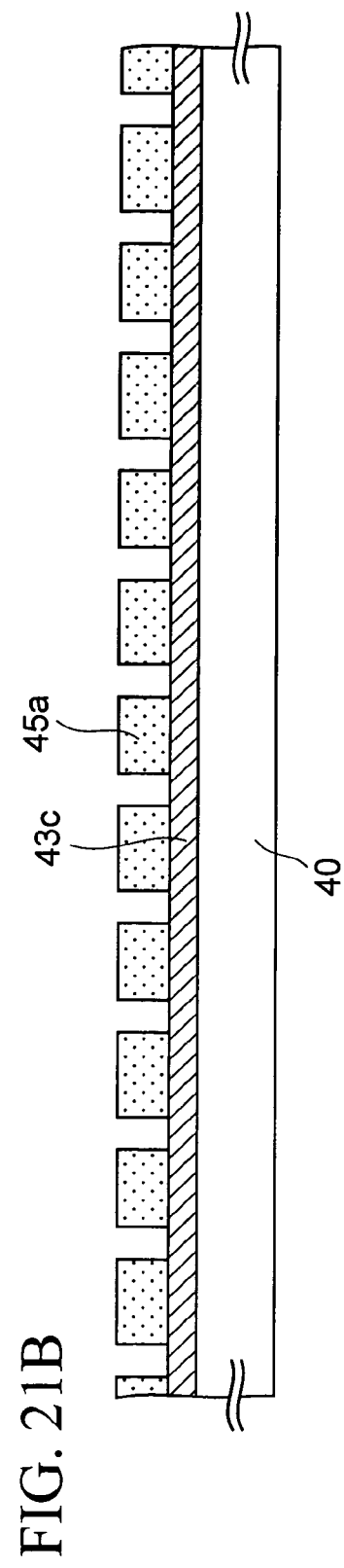

Subsequently, as shown in FIG. 21B, after completing the exposure by the electron beam EB, the electron-beam resist 45 is developed, so that a resist pattern 45a is formed.

After the resist pattern 45a is formed in this manner, the process proceeds to step S16 in FIG. 20.

In step S16, the width of the window in the resist pattern 45a is measured by use of a length measuring machine such as a CD-SEM (Critical Dimension-Scanning Electron Microscope). Then, it is inspected whether the measured value resides within a specification value.

Here, if the measured value is judged as not residing the specification value (NO), the process proceeds to step S21, where the exposure condition of the electron-beam exposure system is changed so that the width of the windows in the resist pattern 45a resides within the specification value.

However, if it is judged that the width of the windows cannot reside within the specification value by merely changing the exposure conditions, the process proceeds to step S20, where the correction parameters of OPC are changed. Thereby, the width of the windows in the resist pattern 45a falls within the specification value.

On the other hand, if it is judged that the width of the windows can fall within the specification value by merely changing the exposure conditions, the process returns to step S15, where a resist pattern 45a is formed on a new transparent substrate 40 and a new translucent film 43c once again.

On the other hand, if it is judged in step S16 that the width of the windows in the resist pattern 45a is within the specification value (YES), the process proceeds to step S17.

In step S17, as shown in FIG. 21C, the translucent film 43c is etched by using the resist pattern 45a as a mask. Thereby, the first mask pattern 43 including the mask openings 43a belonging to the first group and the mask openings 43b belonging to the second group is formed.

Thereafter, the resist pattern 45a is removed. Thereby, the basic structure of the first exposure mask 41 according to this embodiment is completed as shown in FIG. 21D.

According to the method of manufacturing the exposure mask described above, the design data $D_0$ on the contact holes 30a is classified into the first group and the second group in step S3 in FIG. 19, and OPC is applied only to the design data $D_0$ belonging to one group in step S6 in FIG. 19. Here, the design data $D_0$, belonging to the group of openings to which OPC is not applied, corresponds to the mask openings 43b functioning as the auxiliary openings. By using the design data $D_0$ belonging to the group of openings to which OPC is not applied as the design data on the auxiliary openings in this manner, the present embodiment makes it possible to manufacture the first exposure mask 43 with a larger depth of focus and with an enhanced OPC precision without producing new design data on the auxiliary openings, while saving time and labor needed for designing the exposure mask.

It should be noted that the second exposure mask 42 (see FIG. 13B) can be manufactured by applying no OPC to the design data $D_0$ belonging to the group of openings to which OPC is applied in the first exposure mask 43, and by applying OPC to the design data $D_0$ belonging to the group of openings to which OPC is not applied in the first exposure mask 43. Therefore, descriptions will be omitted for the method of manufacturing a second exposure mask 42.

Second Embodiment

Figure 22:
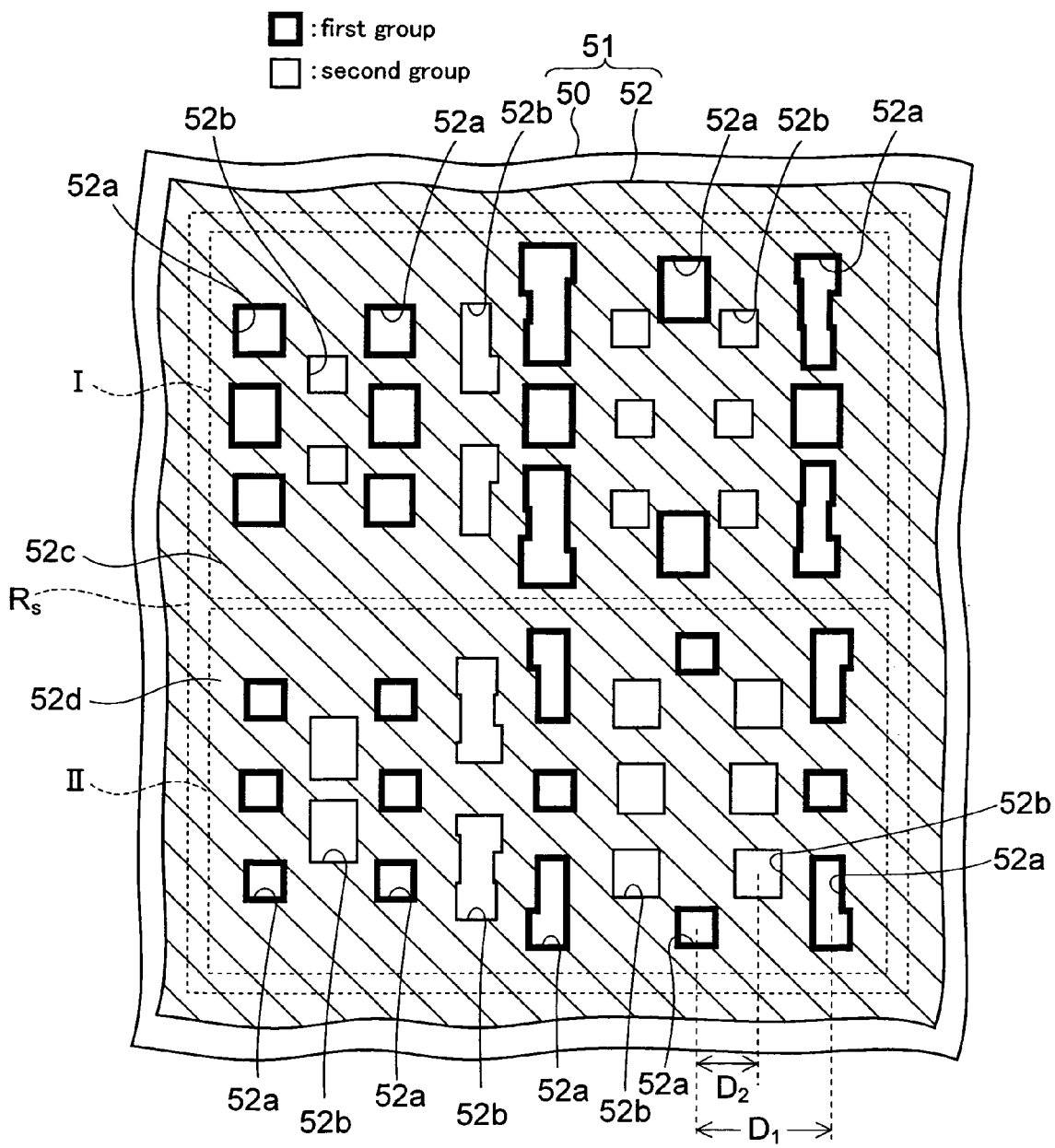
FIG. 22 is a plan view of an exposure mask according to a second embodiment of the present invention.

Descriptions will be provided next for a second embodiment of the present invention.
Exposure Mask FIG. 22 is a plan view of an exposure mask 51 used in the present embodiment.

This exposure mask 51 is a halftone mask used for obtaining the contact holes 10a shown in FIG. 10. This exposure mask 51 includes a translucent film 52 on a transparent substrate 50. Examples of the translucent film 52 include a MoSi film. Examples of the transparent substrate 50 include a quartz substrate.

A shot region $R_s$ on the transparent substrate 50 is divided by its center line into a first region I and a second region II. The translucent film 52 in the first region I and in the second region II function respectively as a first mask pattern 52c and a second mask pattern 52d.

In the first mask pattern 52c formed in the first region I, a plurality of mask openings, each corresponding to the contact holes, is formed to be classified into a first group and a second group. In the illustrated case, mask openings 52a (first mask openings) belong to the first group, and mask openings 52b (second mask openings) belong to the second group. Of these two groups, OPC is applied to the mask openings 52a belonging to the first group, and OPC is not applied to the mask opening 52b belonging to the second group.

On the other hand, in the second mask pattern 52d formed in the second region II, mask openings 52a and mask openings 52b are classified respectively as the first group and the second group in the same manner as in the first mask pattern 52c. Of these mask openings 52a and 52b, OPC is applied only to the mask openings (fourth mask openings) 52b belonging to the second group. OPC is not applied to the mask openings (third mask openings) 52a belonging to the first group.

As described in the first embodiment, mask openings, to which OPC is applied, are usually 1.3 to 1.5 times as large in size as those to which OPC is not applied.

Therefore, the mask openings 52a belonging to the first group in the first region I are larger than the mask openings 52a that belongs to the first group in the second region II and locates at the corresponding positions of the openings 52a in the second region II. Similarly, the mask openings 52b belonging to the second group in the second region II are larger than the mask openings 52b that belong to the second group in the first region I and locates at the corresponding positions of the openings 52b in the first region I.

In addition, the mask openings 52a and 52b in the first region I are arranged in the same manner as the mask openings 52a and 52b in the second region II. Therefore, the exposure mask 51 is advantageous for a device in which contact holes in the first region I of a silicon substrate are arranged in the same manner as in the second region II.

It should be noted that the way of classification of the openings is not particularly limited. As in the case of the first embodiment, however, it is preferable that the classification be made in a manner that minimum pitches $D_1$ between horizontally-neighboring mask openings 52a belonging to the first group becomes twice as large as minimum pitches $D_2$ between all of the horizontally-neighboring mask openings 52a and 52b in the regions I and II.
Patterning Method Descriptions will be provided next for a film patterning method using this exposure mask 51 by referring to FIGS. 23A to 23C.

Figure 23A:
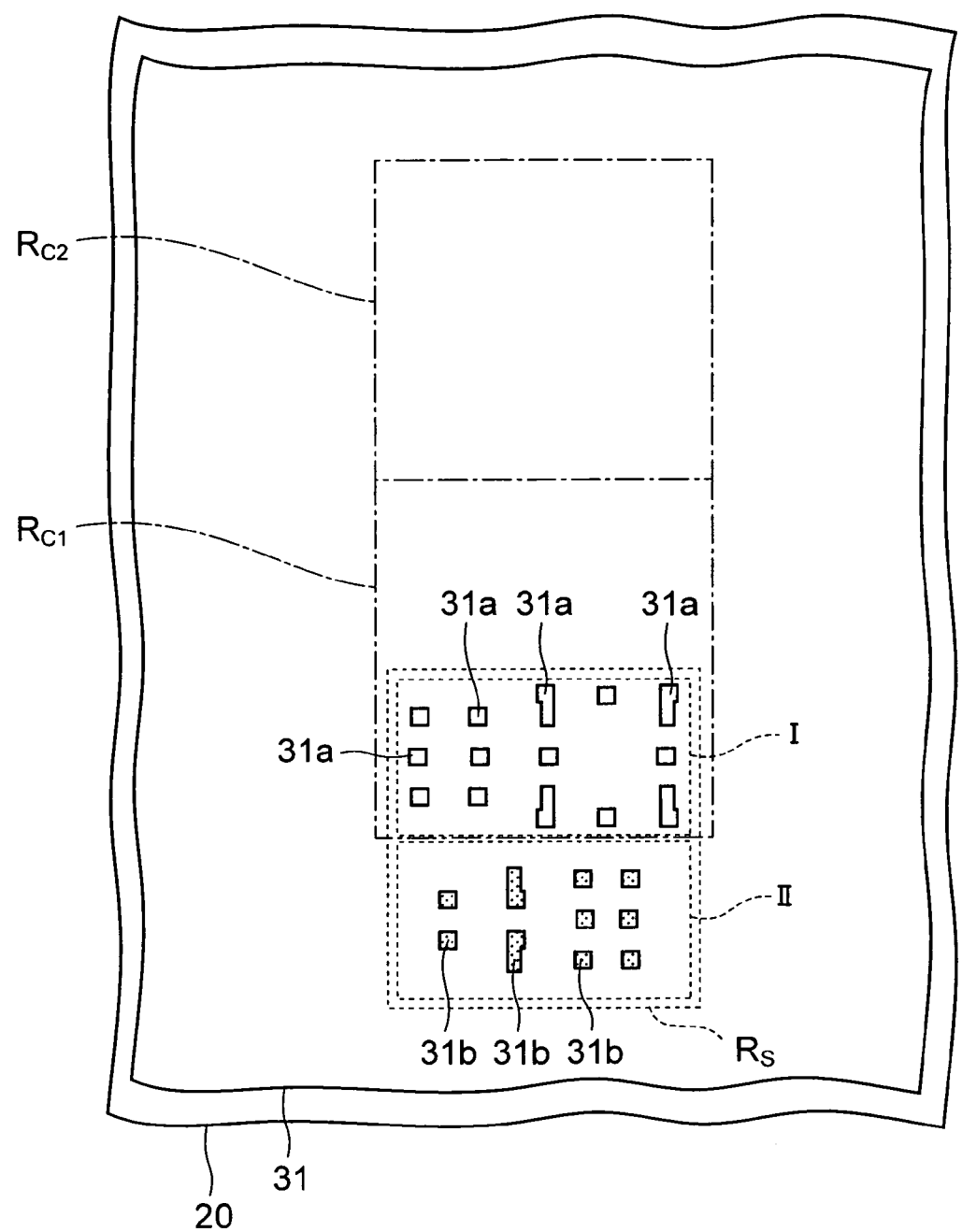
FIGS. 23A to 23C are plan views each illustrating a film patterning method according to the second embodiment of the present invention.
Figure 23B:
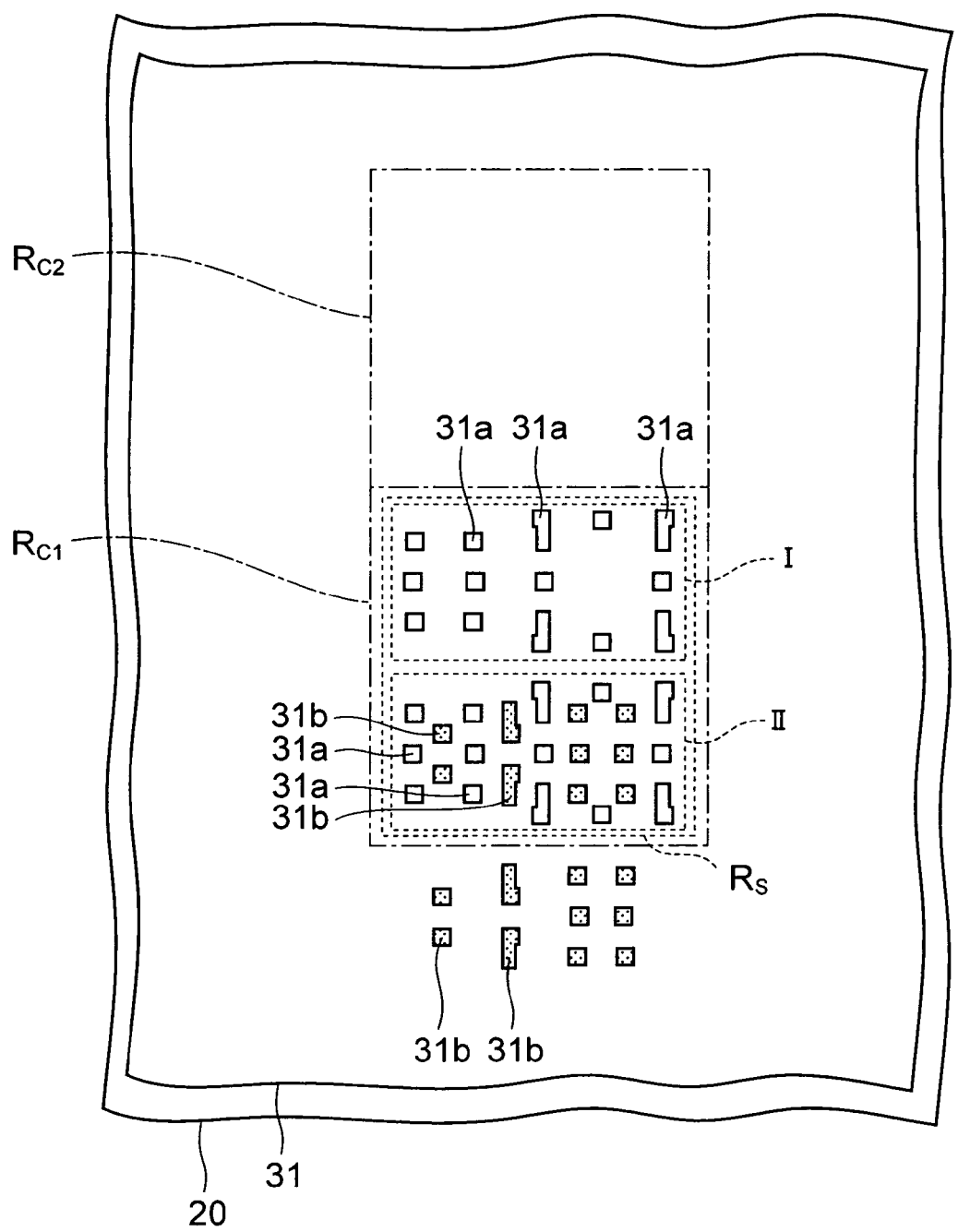
Figure 23C:
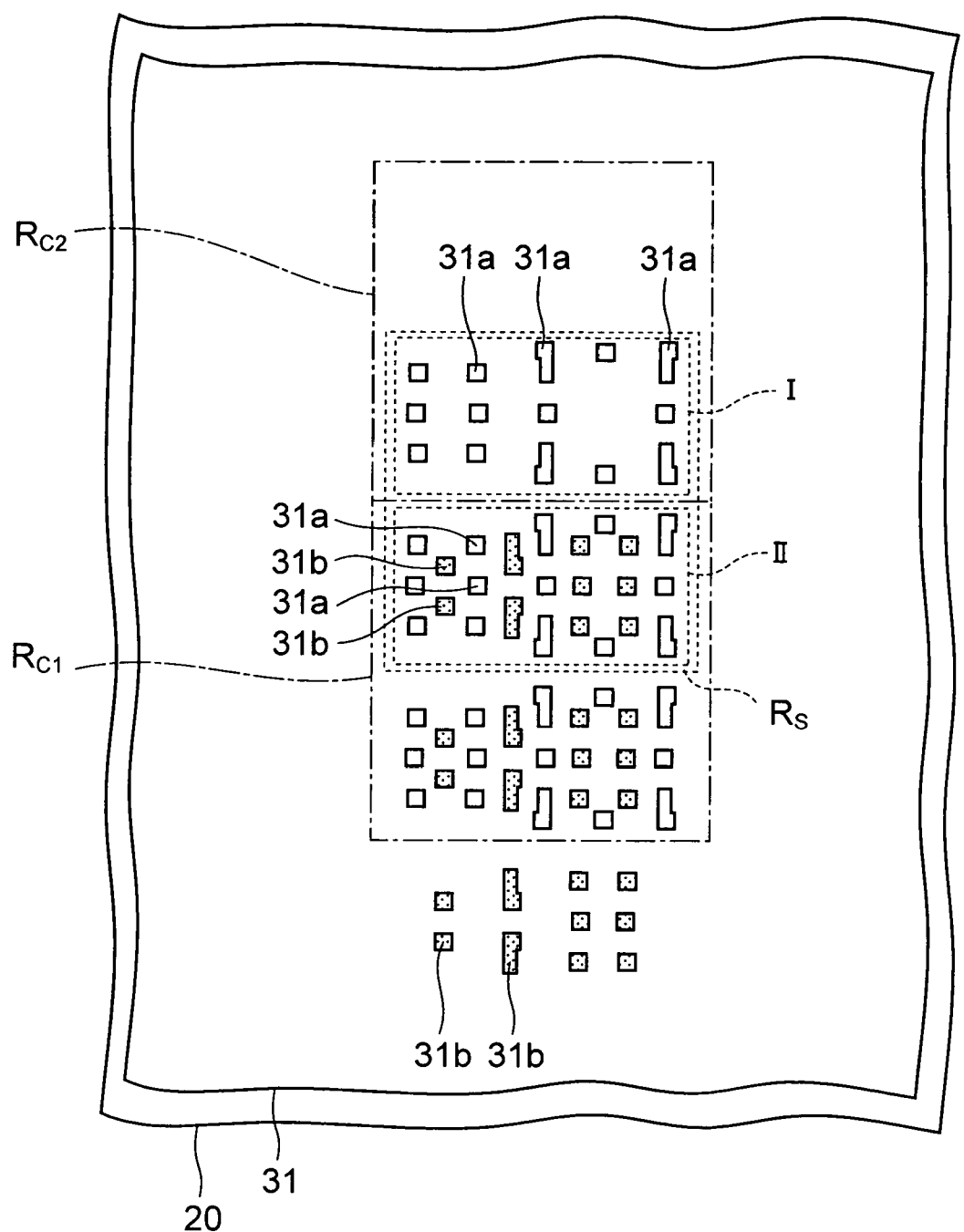

FIGS. 23A to 23C are plan views each illustrating the patterning method according to the present embodiment.

In the present embodiment, the photoresist 31, formed in accordance with the first embodiment shown in FIGS. 14A to 14C, is exposed as follows.

First, the silicon substrate 20 is placed on a stage of the exposure system such as a stepper, as shown in FIG. 23A. Subsequently, exposure light such as ArF laser light is irradiated on the shot region $R_s$ of the exposure mask 51. Thereby, the first mask pattern 52c and the second mask pattern 52d are projected on the photoresist 31.

A first chip region $R_{c1}$ and a second chip region $R_{c2}$ are defined by the device isolation insulating film 21 (see FIG. 14A) in the silicon substrate 20. It should be noted that, although more than two chip regions are defined in the silicon substrate 20 in the actual device, only the two regions $R_{c1}$ and $R_{c2}$ out of the multiple regions are illustrated in order to facilitate the understandings in the present embodiment.

The exposure is made in such a way that only a half of the shot region $R_s$ of the exposure mask 51, e.g., only the first region I, overlaps with the first chip region $R_{c1}$. Thus, the mask pattern 52d formed in the second region II is projected out of the first chip region $R_{c1}$.

In the first region I, the mask openings 52a to which OPC is applied form their images on the photoresist 31. Thus, the first exposed parts 31a corresponding respectively to these mask openings 52a are formed in the photoresist 31. By contrast, the images of the respective mask openings 52b, to which OPC is not applied, deform and do not resolve in the photoresist 31 due to an optical proximity effect or, even if they form images in the photoresist 31, size of the images becomes smaller than the case where the OPC is applied to the mask openings 52b.

Moreover, as in the case of the first embodiment, the mask openings 52b, to which OPC is not applied, function as the auxiliary openings for the mask openings 52a to which OPC is applied. Therefore, it is made possible to make the depth of focus of the exposure mask 51 deeper. Accordingly, even if some defocus exists in the exposure, the sizes of the first exposed portions 31a can be made closer to the designed value.

On the other hand, in the second region II, it is the mask openings 52b that the OPC is applied to, and the OPC is not applied to the mask openings 52a. Therefore, the mask openings 52b, to which OPC is applied, form their images on the photoresist 31, so that the second exposed portions 31b are formed. On the contrary, the mask openings 52a, to which OPC is not applied, do not form their images on the photoresist 31.

After the first exposure is completed in this manner, the stage of the exposure system is displaced by a half chip so as to include the shot region $R_s$ of the exposure mask 51 in the first chip region $R_{c1}$.

Subsequently, exposure light is again irradiated on the shot region $R_s$ of the exposure mask 51. Thereby, the second mask patterns 52d are projected on the photoresist 31 in a manner that the images of the second mask pattern 52d overlaps with the portions of the photoresist 31 where the first mask patterns 52c are projected in the first exposure By this exposure, the second exposed portions 31b corresponding to the mask openings 52b of the second mask pattern 52d are formed in the second region II of the second exposure. Moreover, the first exposed portions 31a corresponding to the mask openings 52a of the first mask pattern 52c are formed in the first region I of the second exposure.

It should be noted that, as in the case of the first exposure, the mask openings 52b to which OPC is not applied in the first region I and the mask openings 52a to which OPC is not applied in the second region II do not form their images on the photoresist 31.

Furthermore, in the regions I and II, the mask openings to which OPC is applied function as the auxiliary openings for the mask openings to which OPC is applied. This makes the depth of focus of the exposure mask 51 deeper.

Subsequently, as shown in FIG. 23C, the stage of the exposure system is further displaced by a half chip, and exposure is carried out again.

By this exposure, in the second region II, the second mask pattern 52d is projected on the photoresist 31 to overlaps with the portions of the photoresist 31 where the first mask pattern 52c is projected in the second exposure. Thus, second exposed portions is formed in the photoresist 31 in the second region II.

With this, the exposure of the first chip region $R_{c1}$ is completed.

After these steps, the entire chip region on the silicon substrate is exposed by carrying out the foregoing double exposure repeatedly while displacing the exposure area by a half chip.

Although the second exposed portions 31b remain unnecessarily formed in a portions below the first chip region $R_{c1}$ in FIG. 23C, these portions reside out of the region of the silicon substrate 20 that can be diced out the chips, so that the number of the chips does not reduced.

Thereafter, PEB is carried out for the photoresist 31.

Figure 24A:
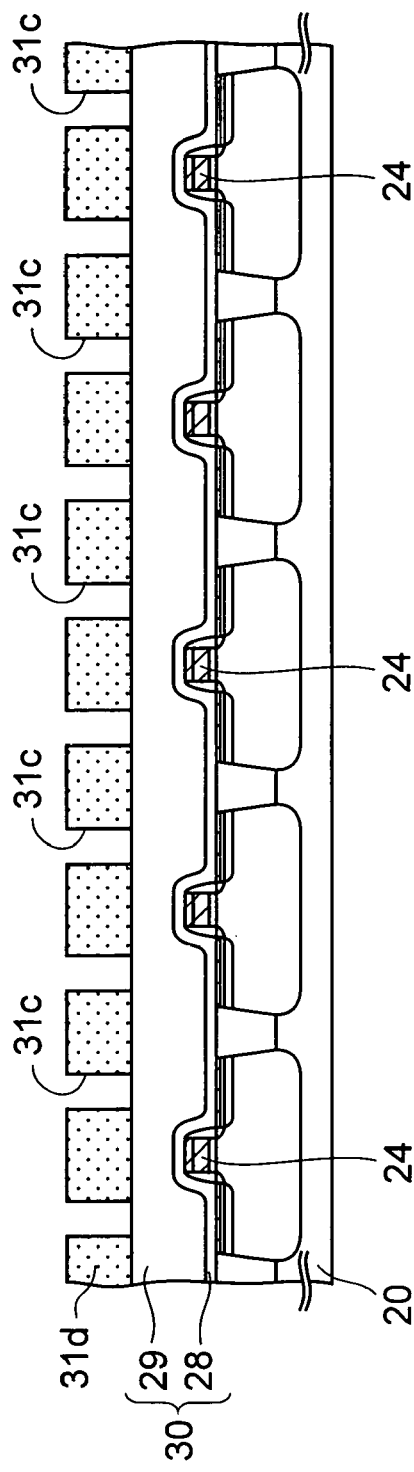
FIGS. 24A to 24B are cross-sectional views each illustrating the film patterning method according to the second embodiment of the present invention.
Figure 24B:
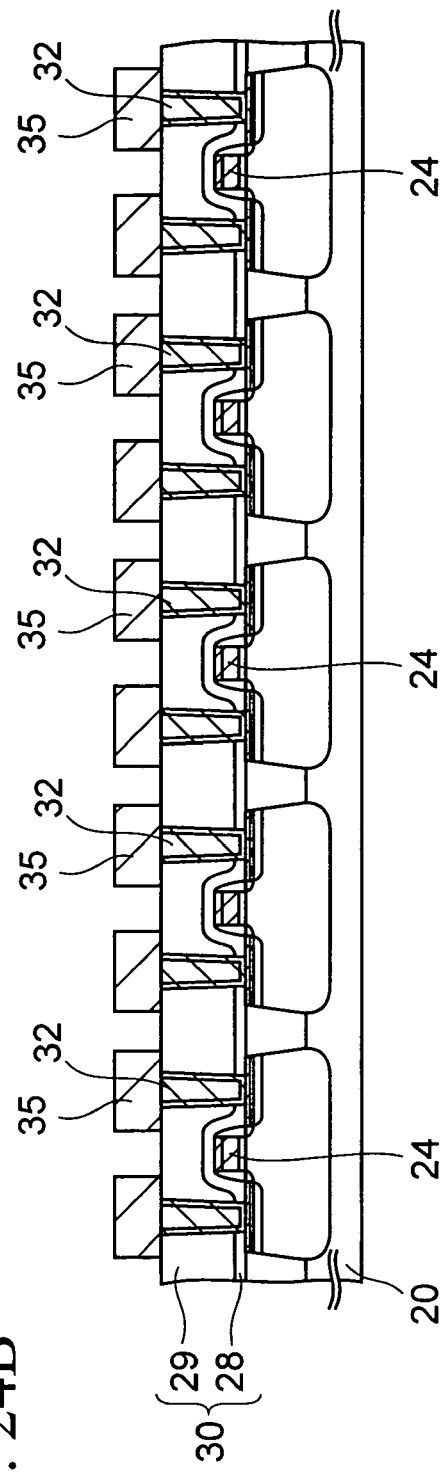

Descriptions will be provided for the subsequent steps by referring to FIGS. 24A and 24B. FIGS. 24A and 24B are cross-sectional views each illustrating the film patterning method according to the present embodiment.

First, as shown in FIG. 24A, the photoresist 31 is developed to remove the exposed portions 31a and 31b. Thus, hole shaped windows 31c are formed, and remaining portions of the photoresist 31 are made into a resist pattern 31d.

After that, as shown in FIG. 24A, contact plugs 31 and metal interconnects 33 are formed by carrying out the same steps as in the FIGS. 14G and 14H of the first embodiment.

By these steps, the basic structure of the semiconductor device is completed.

In the present embodiment, as shown in FIG. 22, the mask openings 52b to which OPC is not applied function as the auxiliary openings for the mask openings 52a to which OPC is applied in the first region I. In the region II, the mask openings 52a function as the auxiliary openings for the mask openings 52b. Thus, it is made possible to make the depth of focus of the exposure mask 51 deeper.

Furthermore, as in the first embodiment, one of the mask openings 52a and 52b, which are originally used to form the device pattern (contact holes), is used as the auxiliary openings to which OPC is not applied. Therefore, it is made possible to make the depth of focus of the exposure mask deeper even in the case where the exposure mask has no space to form new auxiliary openings due to a higher integration of device patterns.

In addition, although two exposure masks are needed in the first embodiment to perform the double exposure, double exposure can be performed by using only the exposure mask 51 in the present embodiment. Therefore, cost for the exposure mask can be lowered in the present embodiment.

It should be noted that the present invention is not limited, to the foregoing embodiments. The present invention can be applied to a device in which both of the first and second region I and II in the exposure mask 51 shown in FIG. 22 are used as chip regions. In this case, the size of the chip is the half of the size of the chips of the present embodiment.

Method of Manufacturing Exposure Mask

Descriptions will be provided next for a method of manufacturing the exposure mask 51 described above.

Figure 25:
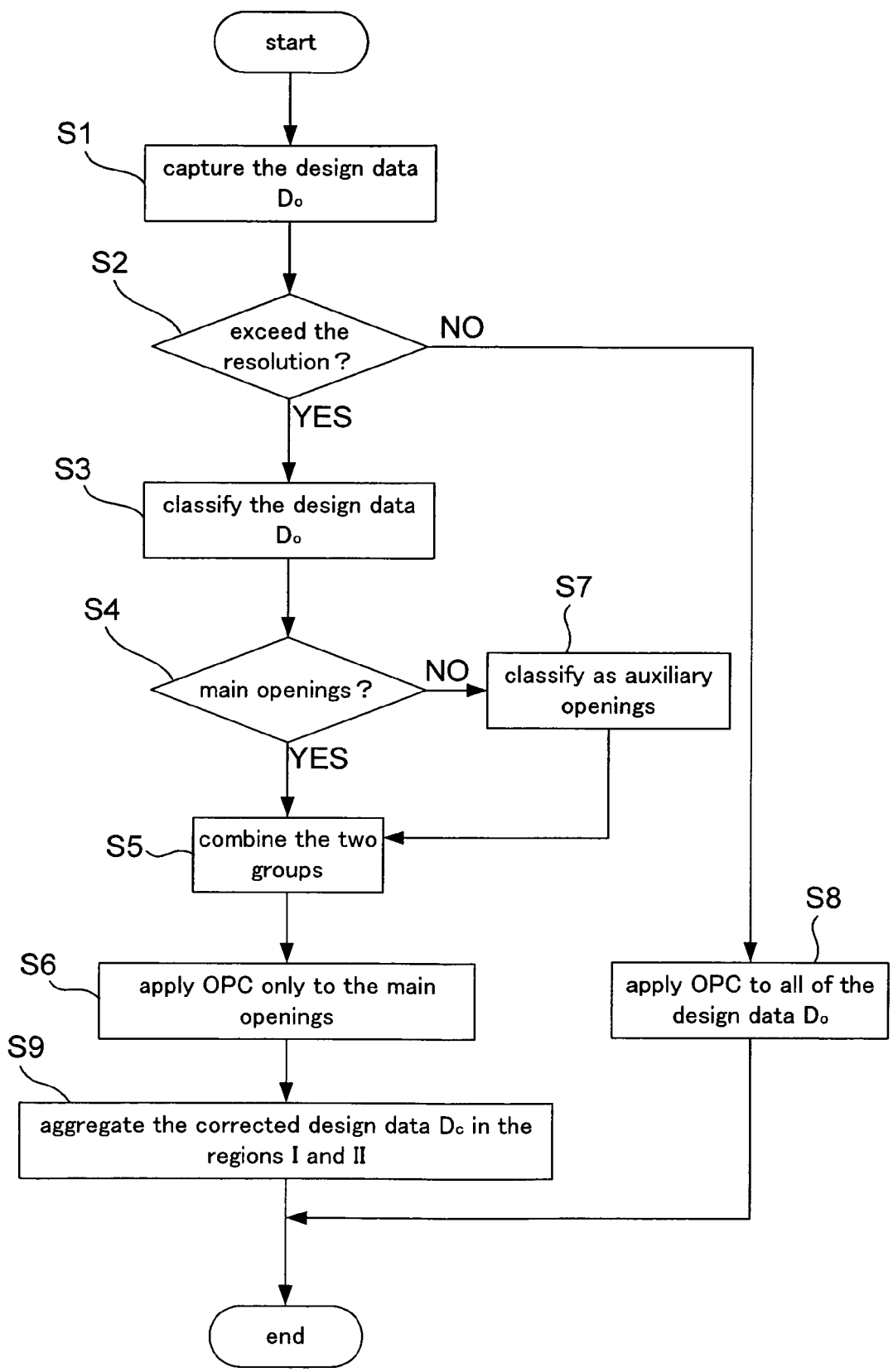
FIG. 25 is a flowchart illustrating a method of designing the exposure mask according to the second embodiment of the present invention.

FIG. 25 is a flowchart showing a method of designing the exposure mask 51 which is carried out by use of the design system 60 shown in FIG. 18. This flowchart is different from that in the first embodiment (see FIG. 19) in that step 9 is carried out after step S6 explained in the first embodiment. Except for this point, the flowchart of the present embodiment is the same as that of the first embodiment.

When the exposure mask 51 is to be designed, the design data $D_0$ on the contact holes 30a is firstly classified into the first group and the second group by performing steps S1 to S3 of the first embodiment.

In the present embodiment, however, such a data is used as the design data $D_0$ in which an arrangement of the mask openings 52a and 52b in the first region I shown in FIG. 22 is the same as the arrangement of the mask openings 52a and 52b in the second region II.

Subsequently, the process proceeds to step S4, where it is judged whether a contact hole 30a located in the left end of the exposure area belongs to the first group or the second group.

Then, in the first region I, the mask openings which belong to the same group as the contact hole 30a located in the left end are classified as the main openings to which OPC is to be applied. On the other hand, in the second region II, the mask openings belonging to a group to which the contact hole 30a located in the left end does not belong are classified as the main openings.

The group of openings which is not classified as the main openings in the regions I and II are classified as the group of auxiliary openings in step S7.

Subsequently, the process proceeds to step S5, where the two groups are combined again.

Next, the process proceeds to step S6, where OPC is applied only to the design data $D_0$ belonging to the group of openings which is classified as the main openings in each of the regions I and II, and thus corrected design data $D_c$ is obtained. It should be noted that OPC is not applied to the design data $D_0$ belonging to the group of openings which is classified as the auxiliary openings in each of the regions I and II.

Thereafter, the process proceeds to step S9, where the corrected design data $D_c$ in the region I and II are aggregated, and thus a predetermined process to be performed on the two sets of design data $D_0$ for manufacturing the exposure mask 51 is completed.

Next, descriptions will be provided for a method of manufacturing the exposure mask 51 using the corrected design data $D_c$ which is obtained in the above.

Basically, the exposure mask 51 is manufactured in accordance with the flowchart shown in FIG. 20 of the first embodiment. Therefore, descriptions will be provided only for contents of steps S15 to S17 in this flowchart in the followings.

Figure 26A:
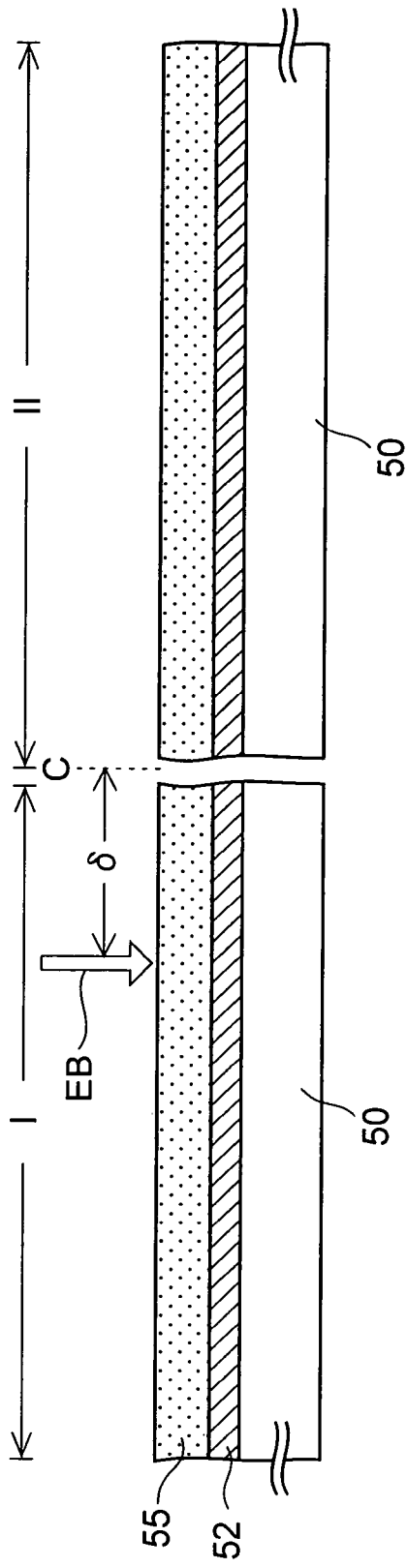
Figure 26B:
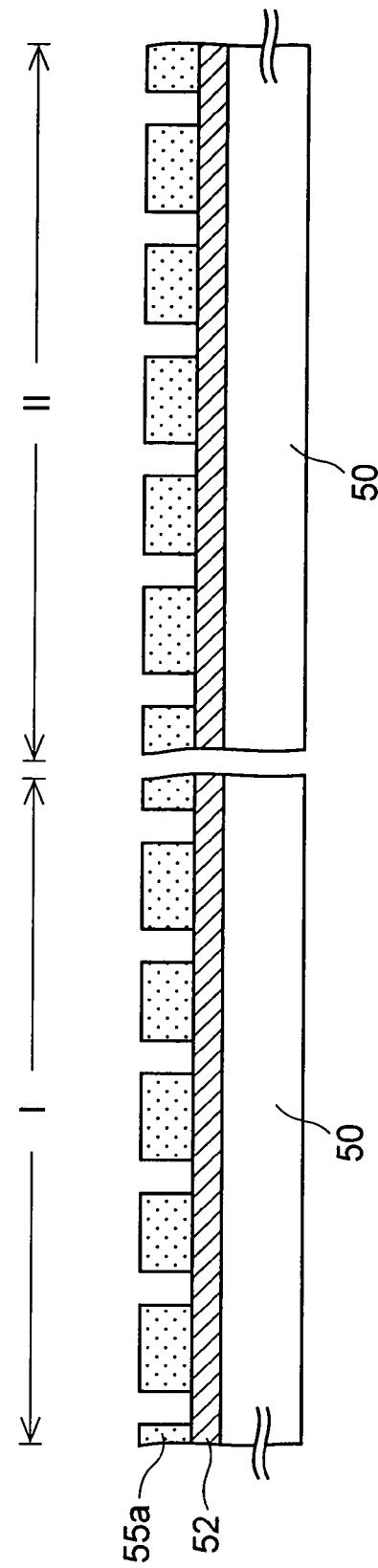

FIGS. 26A and 26B are cross-sectional views each illustrating contents of the process carried out in step S15 in the present embodiment.

In step S15, as shown in FIG. 26A, an electron-beam resist 55 is applied to the translucent film 52 formed on the transparent film 50. Examples of the translucent film 52 include a MoSi film. Thereafter, the electron-beam resist 55 is exposed in the electron beam exposure system (not shown).

In this exposure, the deflection amount 8 of the electron beam EB from the optical axis C is calculated on the basis of the corrected design data $D_c$. Then, the electron-beam resist 55 in the regions I and II is exposed by the electron beam EB.

Subsequently, as shown in FIG. 26B, the electron-beam resist 55 is developed after the exposure by electron beam EB is completed, thereby forming a resist pattern 55a.

With this, the basic steps in step S15 are completed.

Thereafter, the process proceeds to step S16 in FIG. 20, which is explained in the first embodiment, to judge whether the width of the window in the resist pattern 55a resides within the specification value.

Then, if the measured value is judged as residing in the specification value (YES), the process proceeds to the step S17.

FIGS. 26C and 26D are cross-sectional views each illustrating the contents of the step S17 in the present embodiment.

In step S17, as shown in FIG. 26C, the translucent film 52 is etched by using the resist pattern 55a as the mask. Thus, the mask openings 52a belonging to the first group are formed in each of the regions I and II. In addition, the mask openings 52b belonging to the second group are formed in each of the regions I and II.

The translucent film 52, in which the mask openings 52a and 52b are thus formed, serves as the first mask pattern 52c in the first region I, and serves as the second mask pattern 52d in the second region II.

Thereafter, as shown in FIG. 26D, the resist pattern 55a is removed. Thus, the basic structure of the exposure mask 51 according to the present embodiment is completed.

Like the first embodiment, the manufacturing method of the exposure mask according to the present embodiment does not requires new design data on the auxiliary openings for the purpose of making the depth of focus of the exposure mask 51 deeper. Therefore, it is made possible to manufacture the exposure mask 51 with a deeper depth of focus and with an enhanced OPC precision, while saving time and labor needed for designing the exposure mask.

Although the embodiments of the present invention is described in detail in the above, present invention is not limited to the embodiments. For example, a binary mask may be used as each of the exposure masks 41, 42 and 51, although the halftone mask is used as the exposure mask 41, 42 and 51 in the foregoing descriptions.

In addition, although the positive type resist is used as the photoresist 31 shown in FIGS. 14C and 23A to 23C in the above, negative type resist may be used instead. By using the negative type resist, present invention can be applied to the case where the remaining pattern, such as metal interconnects, is to be obtained.

Moreover, the foregoing embodiments may be applied to an exposure step for manufacturing a liquid crystal display device, instead of the exposure step for manufacturing the semiconductor device.

Furthermore, when openings 43a and 43b is classified into the first and second groups, these groups are alternately arranged in a way that each of the groups comes in every two hole columns, as shown in FIG. 13. However, the way of arrangement of the groups is not limited to this, and the first and second group may be arranged in grid-like shape.

As described above, in the present invention, the mask openings corresponding to the device patterns are classified into the two groups. Then the mask openings belonging to one group are used as the main openings, while the mask openings belonging to the other group are used as the auxiliary openings. This makes it possible to manufacture an exposure mask with a deeper depth of focus and with an enhanced optical proximity correction precision without creating new design data on the auxiliary openings.

What is claimed is:

1. A method of manufacturing a semiconductor device comprising:

forming a film over a substrate;

forming a photoresist over the film;

exposing the photoresist using a first mask pattern, wherein a first mask opening and a second mask opening being formed in the first mask pattern, an optical proximity correction being applied to the first mask opening, a first part of the photoresist is exposed by the first mask opening, and a second part of the photoresist is exposed by the second mask opening;

exposing the photoresist using a second mask pattern, wherein the second mask pattern includes a third mask opening and a fourth mask opening, an optical proximity correction being applied to the fourth mask opening, the first part of the photoresist is exposed by the third mask opening, and the second part of the photoresist is exposed by the fourth mask opening;

after the exposing using the first mask pattern and the exposing using the second mask pattern, developing the photoresist to form a resist pattern; and etching the film using the resist pattern as a mask.

2. The method of claim 1, wherein the exposing of the photoresist using the first mask pattern includes exposing the photoresist in one chip region by use of a first exposure mask in which the first mask pattern is formed, and the exposing of the photoresist using the second mask pattern includes exposing the photoresist in the chip region by use of a second exposure mask in which the second mask pattern is formed.

3. The method of claim 1, wherein the exposing of the photoresist using the first mask pattern includes using an exposure mask where the first mask pattern and the second mask pattern are formed respectively in a first region and a second region in a shot region of the exposure mask, and the exposing of the photoresist using the second mask pattern includes using the exposure mask so that a projection image of the second mask pattern overlaps with a portion of the photoresist on which the first mask pattern is projected.

4. The method of claim 3, wherein a half of the shot region is the first region and the other half of the shot region is the second region, the exposing of the photoresist using the second mask pattern includes displacing an exposure area by half of the chip than in the exposing of the photoresist using the first mask pattern on the photoresist.

5. The method of claim 4, wherein the exposing of the photoresist using the first mask pattern and the exposing of the photoresist using the second mask pattern are alternately repeated by displacing the exposure area by half of the chip to expose the photoresist in the plurality of chip regions.

6. The method of claim 1, wherein the first mask opening corresponds to a hole in the film.

7. The method of claim 1, wherein the photoresist is of a positive type.

8. A method of manufacturing of a semiconductor device comprising:

forming a film over a substrate;

forming a photoresist over the film;

first exposing of a first mask opening and a second mask opening to the photoresist, where the first mask opening being applied with an optical proximity correction, and the second mask opening being not applied with an optical proximity correction, a first part of the photoresist is exposed by the first mask opening, and a second part of the photoresist is exposed by the second mask opening;

second exposing of a third mask opening and a fourth mask opening to the photoresist, where the third mask opening being not applied with an optical proximity correction, and the fourth mask opening being applied with an optical proximity correction, the first part of the photoresist is exposed by the third mask opening, and the second part of the photoresist is exposed by the fourth mask opening;

developing the photoresist to form a first resist pattern in the first part of the photoresist and a second resist pattern in the second part of the photoresist; and etching the film to form a first device pattern using the first resist pattern as a mask and to form a second device pattern using the second resist pattern as a mask.

9. The method of claim 8, wherein the film is an interlayer insulating film, and the first device pattern and the second device pattern are contact holes.

10. The method of claim 8, wherein the second mask opening is an assist pattern in the first exposing, and the third mask opening is an assist pattern in the second exposing.

11. The method of claim 8, wherein an interval between the first device pattern and the second device pattern is not larger than 150 nm.

12. The method of claim 8, wherein the photoresist is of a positive type.

13. An exposure mask comprising:

a transparent substrate;

a first mask pattern formed in a first region of the transparent substrate, a first mask opening and a second mask opening being formed in the first mask pattern, the first mask opening corresponding to a first device pattern, the second mask opening corresponding to a second device pattern, and an optical proximity correction being applied to the first mask opening; and a second mask pattern formed in a second region of the transparent substrate, the second mask pattern including a third mask opening corresponding to the first device pattern and a fourth mask opening corresponding to the second device pattern, and an optical proximity correction being applied to the fourth mask opening, wherein an arbitrary side of the second mask opening is parallel to a side of the first mask opening, and an arbitrary side of the third mask opening is parallel to a side of the fourth mask opening.

14. The exposure mask of claim 13, wherein the first region is a half of a shot region, and the second region is the other half of the shot region.

15. The exposure mask of claim 13, wherein the first and second mask openings in the first region are arranged in the same manner as the third and fourth mask openings in the second region.

16. The exposure mask of claim 13, wherein the first mask pattern is larger than the third mask opening, and the fourth mask pattern is larger than the second mask opening.

17. The exposure mask of claim 13, wherein a plurality of the first to the fourth mask patterns are formed, and minimum arrangement pitches between the first mask openings are twice as large as minimum arrangement pitches between all of the first to the fourth mask openings.

18. The method of claim 9, further comprising:

forming conductive plugs in the contact holes.

19. The method of claim 18, wherein the conductive plugs have a depth that reaches the substrate.

20. The method of claim 19, further comprising:

forming wiring layers coupled to the conductive plugs over the conductive plugs.

* * * * *